US012750956B2

(12) United States Patent
Wu et al.

(10) Patent No.: US 12,750,956 B2
(45) Date of Patent: Sep. 29, 2026

(54) DISPLAY DEVICE

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 238 days.

(21) Appl. No.: 18/792,518

(22) Filed: Aug. 1, 2024

(65) Prior Publication Data

US 2024/0397629 A1 Nov. 28, 2024

Related U.S. Application Data

(63) Continuation of application No. 18/138,125, filed on Apr. 24, 2023, now Pat. No. 12,082,343, which is a continuation of application No. 17/224,134, filed on Apr. 7, 2021, now Pat. No. 11,659,666.

(30) Foreign Application Priority Data

May 7, 2020 (CN) ........................ 202010378329.7

(51) Int. Cl.

| | |
|---|---|
| ***H05K 1/18*** | (2026.01) |
| ***H05K 1/189*** | (2026.01) |
| ***H10W 90/00*** | (2026.01) |
| *H10D 86/40* | (2025.01) |
| *H10D 86/60* | (2025.01) |

(52) U.S. Cl.

CPC ............ *H05K 1/189* (2013.01); *H10W 90/00* (2026.01); *H05K 2201/10128* (2013.01); *H10D 86/441* (2025.01); *H10D 86/60* (2025.01)

(58) Field of Classification Search

CPC .......... H05K 1/18; H05K 1/147; H05K 1/189; H05K 2201/10128; G09F 9/301; H10D 86/441

USPC .......................................................... 361/749

See application file for complete search history.

(56) References Cited

U.S. PATENT DOCUMENTS

2013/0076612 A1* 3/2013 Myers ................ G06F 3/04817 29/729

2021/0334502 A1* 10/2021 Lee .................... G06V 40/1318

* cited by examiner

*Primary Examiner* — Tremesha W Burns

(74) *Attorney, Agent, or Firm* — Winston Hsu

(57) ABSTRACT

A display device includes a display panel in a bent form. The display panel includes two first edges opposite to each other and surrounding a surrounding axis, two second edges opposite to each other, a display surface, and a back surface opposite to the display surface, wherein the two first edges and the two second edges surround the display surface and the back surface. A first flexible circuit board includes a circuit component disposed thereon for controlling the display panel to display image and is electrically connected to the display panel and contacts the back surface of the display panel through an adhesive layer.

12 Claims, 17 Drawing Sheets

DISPLAY DEVICE

CROSS REFERENCE TO RELATED APPLICATIONS

This application is a continuation application of U.S. application Ser. No. 18/138,125, filed on Apr. 24, 2023, which is a continuation application of U.S. Application Ser. No. 17/224,134, filed on Apr. 7, 2021. The contents of these applications are incorporated herein by reference.

BACKGROUND OF THE DISCLOSURE

1. Field of the Disclosure

The present disclosure relates to a display device.

2. Description of the Prior Art

In order to meet the needs for various functions or improve user convenience, a display device having a surrounding display surface has gradually attracted attention in the technology field.

SUMMARY OF THE DISCLOSURE

One aspect of the present disclosure is to provide an electronic device, more particularly, a display device.

An embodiment of the present disclosure, a display device is disclosed. The display device includes a display panel in a bent form. The display panel includes two first edges opposite to each other and surrounding a surrounding axis, two second edges opposite to each other, a display surface, and a back surface opposite to the display surface, wherein the two first edges and the two second edges surround the display surface and the back surface. A first flexible circuit board includes a circuit component disposed thereon for controlling the display panel to display image and is electrically connected to the display panel and contacts the back surface of the display panel through an adhesive layer.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

The accompanying drawings are included to provide a further understanding of the embodiments, and are incorporated in and constitute a part of this specification. For ease of understanding, same reference numerals are used to indicate the same elements in the drawings. It should be understood that the elements disclosed in one embodiment may be used in other embodiments without specific description. The drawings in this disclosure are not drawn to scale unless being specifically specified. For clarity of presentation, the drawings are simplified and some details or elements are omitted.

DETAILED DESCRIPTION

Figure 1A:
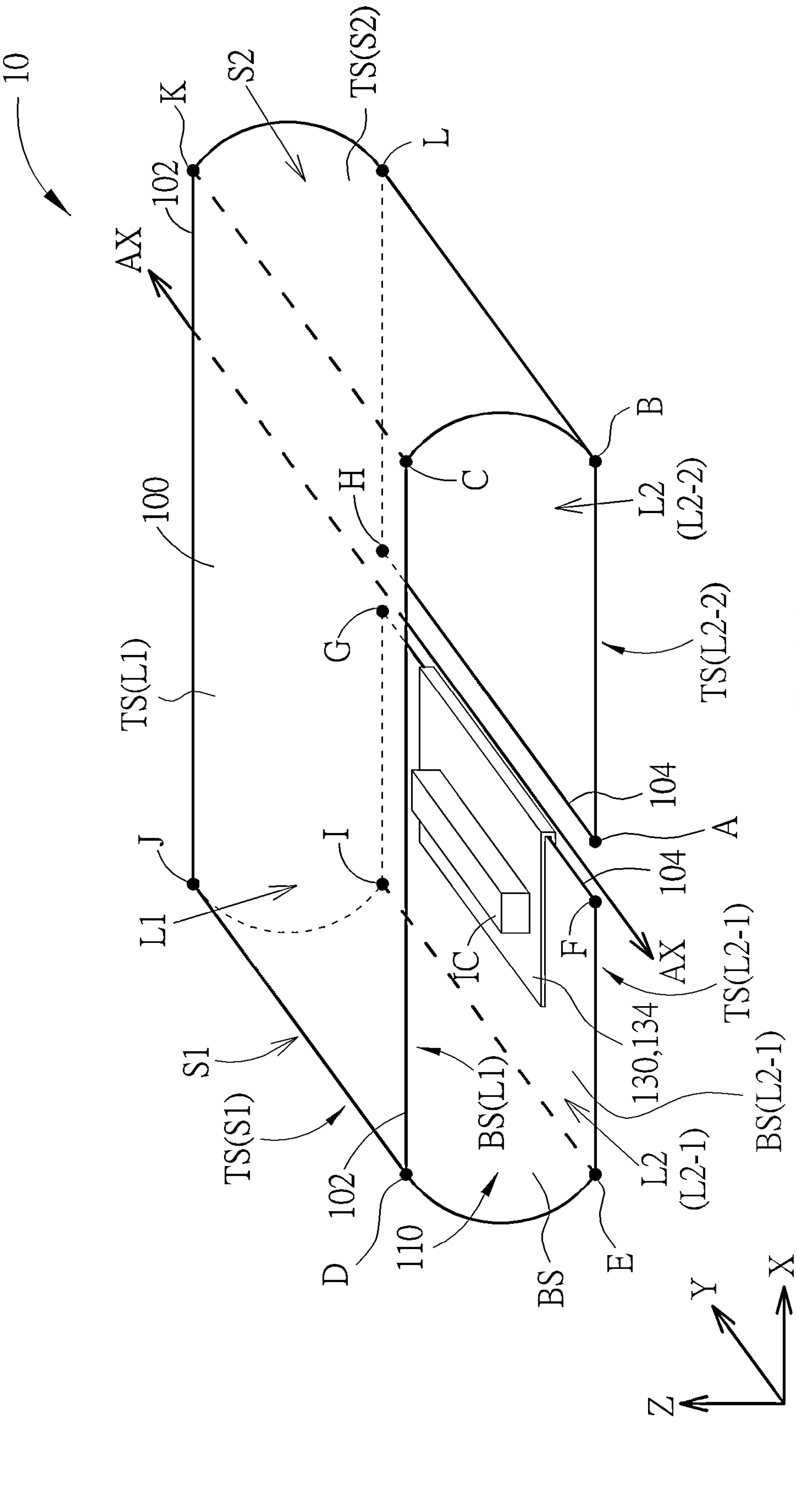
FIG. 1A is a schematic diagram showing the structure of a display device according to an embodiment of the disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". It will be understood that when a component is referred to as being "connected to" another component (or its variant), it may be directly connected to the "another component", or connected to the "another component" through one or more intervening components.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

The term "substantially" usually means falling within 20% of a given value or range, or within 10%, 5%, 3%, 2%, 1%, or 0.5% of a given value or range.

Although the terms such as first, second, etc., may be used in the description and following claims to describe various components in claims, these terms does not mean or represent the claimed components have order and does not represent the order of one claimed component and another one claimed component, or the sequence in manufacturing method. These terms are used to discriminate a claimed component with a denomination from another one claimed component with the same denomination.

The term "wraparound" used in this disclosure refers to wrap around an axis with an angle greater than or equal to 270 degrees. The term "wraparound surface" used in this disclosure refers to a surface in a wraparound form with a wrapping angle greater than or equal to 270 degrees around an axis to provide various user interfaces. In other words, it is not necessary for a wraparound surface to have a complete 360-degree wrapping angle when in a wraparound form, as long as the wrapping angle is greater than or equal to 270 degrees.

It should be noted that the technical features in different embodiments described in the following description may be replaced, recombined, or mixed with one another to constitute another embodiment without departing from the spirit of the present disclosure.

The electronic device provided in the present disclosure may include, for example, an antenna or a display device, but is not limited thereto. Embodiments of the display device of the present disclosure may include any display device that displays images or pictures, such as a non-self-light-emitting liquid crystal display (LCD), a light emitting diode (LED) display, or an electro-phoretic display (EPD), but is not limited thereto. The light emitting diode display may include organic light emitting diode (OLED) display, inorganic light emitting diode (LED) display, sub-millimeter light emitting diode (mini LED) display, micro light emitting diode (micro LED) display, quantum dot LED (QLED) display, but is not limited thereto. In the following description, embodiments in which the electronic device is a display device are illustrated. In other embodiments, the electronic device may be an antenna or other types of electronic devices, and the display panel of the electronic device may be replaced with a working panel.

The display device of the present disclosure includes a flexible display panel. The term "flexible" means that the display panel may be bent, warp, folded, stretched, flexed, or may be subjected to other deformation operations. The display device of the present disclosure may be bent to have a wraparound form to provide various user interfaces on a wrapping surface surrounding over 270 degrees. For example, display device of the present disclosure may display images, provide touch function or sense function on a surface surrounding over 270 degrees, but is not limited thereto. It should be noted that the display panel (or working panel) of the electronic device in a wraparound form provided by the present disclosure does not necessarily have to surround 360 degrees. The display panel (or working panel) of the electronic device in a wraparound form may surround greater than or equal to 270 degrees to achieve the wraparound user interfaces. Furthermore, the wraparound shape of the display panel provided by the present disclosure may be any shapes according to product needs. For example, the display panel may have a wraparound shape of rectangular cylinder, cylinder, elliptical cylinder, triangular cylinder, or polygonal cylinder, but is not limited thereto. In practice, the different portions of the display panel (or working panel) of the electronic device may respectively be planar or curved, but is not limited thereto.

Figure 1B:
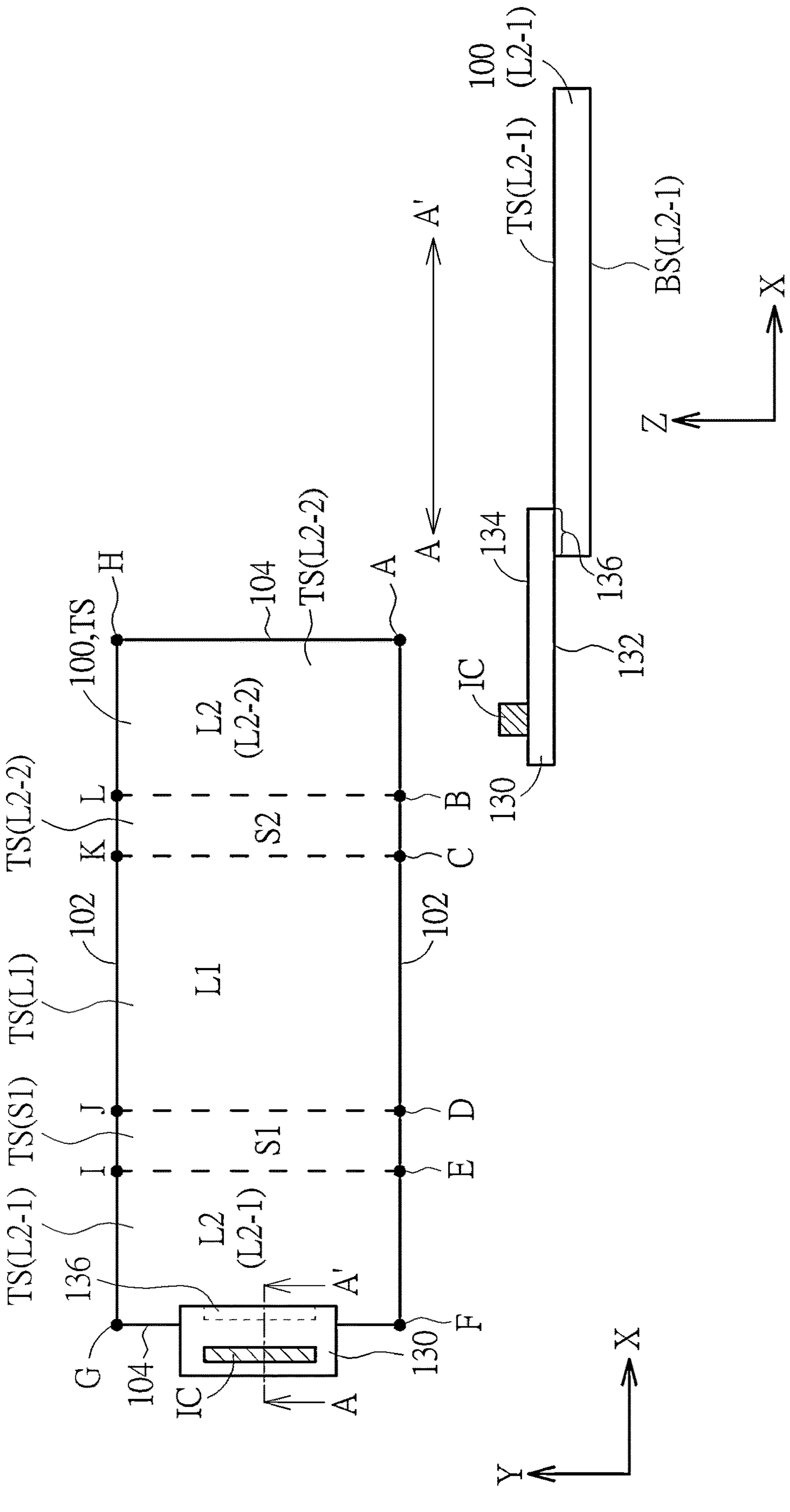
FIG. 1B is a schematic diagram showing the structure of a display device according to an embodiment of the disclosure. The upper-left portion of FIG. 1B shows a schematic plan view of a display panel and a flexible circuit board of a display device in a non-wraparound form. The lower-right portion of FIG. 1B is a schematic cross-sectional view of the display device along the line A-A' in the plan view.

Please refer to FIG. 1A and FIG. 1B. FIG. 1A is a schematic diagram showing a structure of a display panel 100 and a flexible circuit board 130 of the display device 10 according to an embodiment of the disclosure. The upper-left portion of FIG. 1B shows a schematic plan view of the display panel 100 and the flexible circuit board 130 of the display device 10 in a non-wraparound form. The lower-right portion of FIG. 1B is a schematic cross-sectional view of the display device 10 along the line A-A' in the plan view.

As shown in FIG. 1A, the display device 10 includes the display panel 100. The display panel 100 may be a flexible display panel. The display panel 100 may include a display surface TS, a back surface BS opposite to the display surface TS, two wraparound edges 102 opposite to each other and two non-wraparound edges 104 opposite to each other. The two wraparound edges 102 and the two non-wraparound edges 104 surround the display surface TS and the back surface BS. Please refer to FIG. 1B. As shown in FIG. 1B, one of the two wraparound edges 102 may include an edge between point A and point B, an edge between point B and point C, an edge between point C and point D, an edge between point D and point E, and an edge between point E and point F. The other one of the two wraparound edges 102 may include an edge between point G and point I, an edge between point I and point J, an edge between point J and point K, an edge between point K and point L, and an edge between point L and point H. The two non-wraparound edges 104 may respectively include the edge between point G and point F and the edge between point H and point A. For the ease of understanding, point A, point B, point C, point D, point E, point F, point G, point H, point I, point J, point K and point L of the display panel 100 are also annotated in FIG. 1A. According to some embodiments of the present disclosure, the display surface TS may include a display region (not shown) that may display images or provide touch functions. According to another embodiment of the present disclosure, optionally, the display surface TS may include a peripheral region (not shown). The area of the display region may be smaller than or equal to the area of the display surface TS. When the area of the display region is equal to the area of the display surface TS, the display surface TS may be a borderless embodiment. The peripheral region may include peripheral circuit components, such as driving components, reset components, compensation components, initialization components, operation control components, light emitting control components, capacitors, inductors, power lines, or a combination thereof, but are not limited thereto. In some embodiments, a portion of the peripheral region may be used for bonding the flexible circuit board 130. The display panel 100 of the display device 10 is bent in such a way that the wraparound edges 102 surround the surrounding axis AX to make the display surface TS of the display panel 100 face toward the outside of the display device 10. The back surface BS of the display panel 100 faces toward the inside of the display device 10 and encompasses the internal space 110 of the display device 10. The internal space 110 may be used to accommodate other components of the display device 10, such as a battery or a control board (not shown). A supporting layer (not shown) may be provided on the back surface BS of the display panel 100 to provide structural support and maintain the shape of the display device 10.

According to some embodiments of the present disclosure, the wraparound edges 102 of the display panel 100 surround the surrounding axis AX by at least 270 degrees, so that the display device 10 may provide various user interfaces on the surface surrounding at least 270 degrees. For example, the display device 10 may display a continuous image or a plurality of non-continuous images on the surface surrounding at least 270 degrees. According to some embodiments of the present disclosure, the wraparound surface may be divided into multiple different application regions. The display panel 100 may be divided into several portions according to different bending angles when the display panel 100 is in the wraparound form. For example, the display panel 100 in the wraparound form may include two long-extending portions opposite to each other and two short-extending portions between the two long-extending portions. One of the two long-extending portions refers to a portion that is approximately planar or has a bending angle (that is, larger bending radius) smaller than that of one of the two short-extending portions, and one of the two short-extending portions refers to a portion that is substantially curved or has a bending angle (that is, smaller bending radius) larger than that of one of the two long-extending portions.

For example, as shown in FIG. 1B, the display panel 100 may be divided into a long-extending portion L1, a long-extending portion L2 that includes a long-extending portion L2-1 and a long-extending portion L2-2, a short-extending portion S1 between the long-extending portion L1 and the long-extending portion L2-1, and a short-extending portion S2 between the long-extending portion L1 and the long-extending portion L2-2. The two non-wraparound edges 104 of the display panel 100 are the edges of the long-extending portion L2-2 and the long-extending portion L2-2, respectively.

When the display panel 100 is in the wraparound form as shown in FIG. 1A, the display surface TS(L1) of the long-extending portion L1 faces toward the outside, the back surface BS(L1) of the long-extending portion L1 faces toward the inside, and the long-extending portion L2-1 and the long-extending portion L2-2 bend toward the back surface BS(L1) of the long-extending portion L1. The display surface TS(L1) of the long-extending portion L1 corresponds to the front display region of the display device 10. According to an embodiment of the present disclosure, the display surface TS(L1) of the long-extending portion L1 may be a planar display region substantially parallel to the XY plane. According to another embodiment of the present disclosure, the display surface TS(L1) of the long-extending portion L1 may be a curved display region having a small bending angle. The display surface TS(L2-1) of the long-extending portion L2-1 and the display surface TS(L2-2) of the long-extending portion L2-2 correspond to the rear display region of the display device 10. According to an embodiment of the present disclosure, the display surface TS(L2-1) and the display surface TS(L2-2) may respectively be a planar display region substantially parallel to the XY plane. According to another embodiment of the present disclosure, the display surface TS(L2-1) and the display surface TS(L2-2) may respectively be a curved display region having a small bending angle. The display surface TS(S1) of the short-extending portion S1 and the display surface TS(S2) of the short-extending portion S2 approximately correspond to the side display regions of the display device 10, and may respectively be a curved side display region having a larger bending angle. In this embodiment, in the bent display panel 100, the long-extending portion L2-1 and the long-extending portion L2-2 do not overlap with each other, forming a gap between the two non-wraparound edges 104.

According to some embodiments of the present disclosure, the flexible circuit board 130 may be attached to one of two long-extending portions through at least a portion of a surface of the flexible circuit board 130. For example, please refer to the upper-left portion of FIG. 1B, the portion of the surface of the flexible circuit board 130 is connected to the non-wraparound edge 104 of the long-extending portion L2. The flexible circuit board 130 may include a circuit component IC disposed thereon to control the operations of the display units (not shown) of the display panel 100 to display images. The circuit component IC may include a driving component, a reset component, a compensation component, an initialization component, an operation control component, a light emitting control component, a capacitor, an inductor, a power line, or a combination thereof, but is not limited thereto. It is advantageous to dispose the circuit component IC on the flexible circuit board 130 instead of on the display panel 100, such that the overall area of the peripheral region of the display panel 100 may be reduced to achieve an approximately borderless display effect.

Please refer to the lower-right portion of FIG. 1B, which is a schematic cross-sectional view of the display device 10 along the line A-A' in the plan view shown in the upper-left portion of FIG. 1B. The flexible circuit board 130 may have a surface 132, a surface 134 that is opposite to the surface 132, and a bonding region 136. The bonding region 136 is formed at a periphery of the surface 132. It should be noted that the "periphery" of the surface 132 refers to any one of the four edges of the surface 132. According to this embodiment, the flexible circuit board 130 partially overlaps the non-wraparound edge 104 of the long-extending portion L2-1 of the display panel 100. In other words, on the Z direction, a portion of the surface 132 of the flexible circuit board 130 overlaps a portion of the long-extending portion L2-1 near the non-wraparound edge 104. The flexible circuit board 130 may include wires or signal lines which are electrically bonded to one of the two non-wraparound edges 104 through the bonding region 136 thereof for driving the display panel 100. As shown in the embodiment shown in the upper-left portion of FIG. 1B, the edge between the point G and the point F and the edge between the point H and the point A are the two non-wraparound edges 104. The bonding region 136 of the flexible circuit board 130 is electrically bonded to the edge between the point G and the point F to drive the display panel 100. In some embodiments, the flexible circuit board 130 and the display panel 100 may be connected through an anisotropic conductive film (ACF), but it is not limited thereto.

When the display panel 100 is in the wraparound form, the flexible circuit board 130 may be bent to extend into the internal space 110. Please refer to FIG. 1A and FIG. 1B, when the circuit component IC is disposed on the surface 134 of the flexible circuit board 130, the flexible circuit board 130 may be bent from the display surface TS(L2-1) of the long-extending portion L2-1, through the space between the long-extending portion L2-1 and the long-extending portion L2-2, and toward the back surface BS(L2-1) long-extending portion L2-1. The flexible circuit board 130 is bent to be close to the back surface BS(L2-1) long-extending portion L2-1, such that a larger portion of the internal space 110 may be reserved to accommodate other components of the display device 10 (such as a battery and/or a control board). A higher utilization rate of the internal space 110 may be achieved, which is beneficial for thinning the display device 10. After the surface 134 of the bent flexible circuit board 130 faces the back surface BS(L1) of the long-extending portion L1, so that the circuit component IC disposed on the surface 134 may be exposed in the internal space 110, which is beneficial for heat dissipation of the circuit component IC. According to some embodiments of the present disclosure, the flexible circuit board 130 may be fixed on the back surface BS(L2-1) of the long-extending portion L2-1 through an adhesive layer, but it is not limited thereto.

Figure 2A:
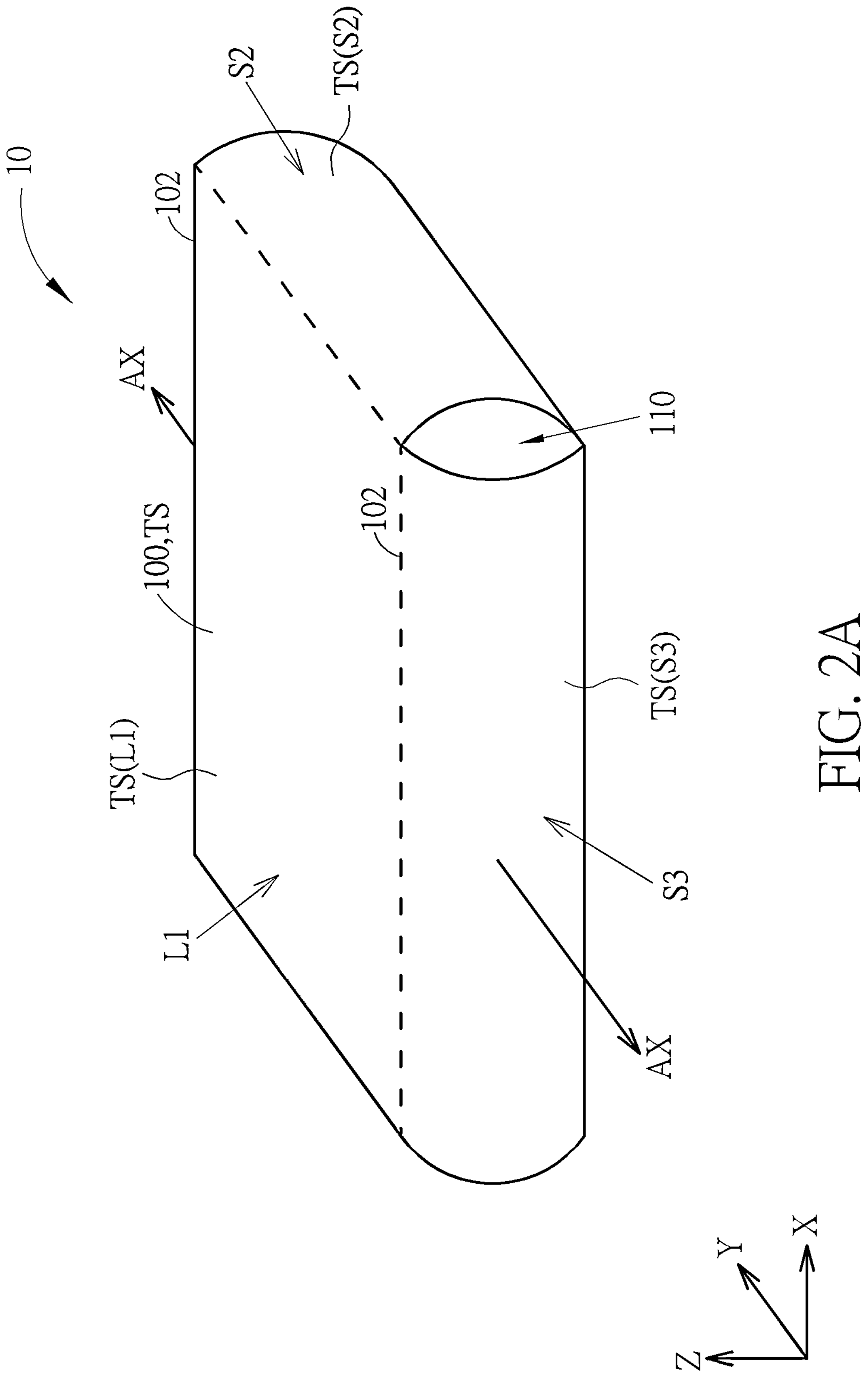
FIG. 2A is a schematic diagram showing the structure of a display device according to an embodiment of the disclosure.
Figure 2B:
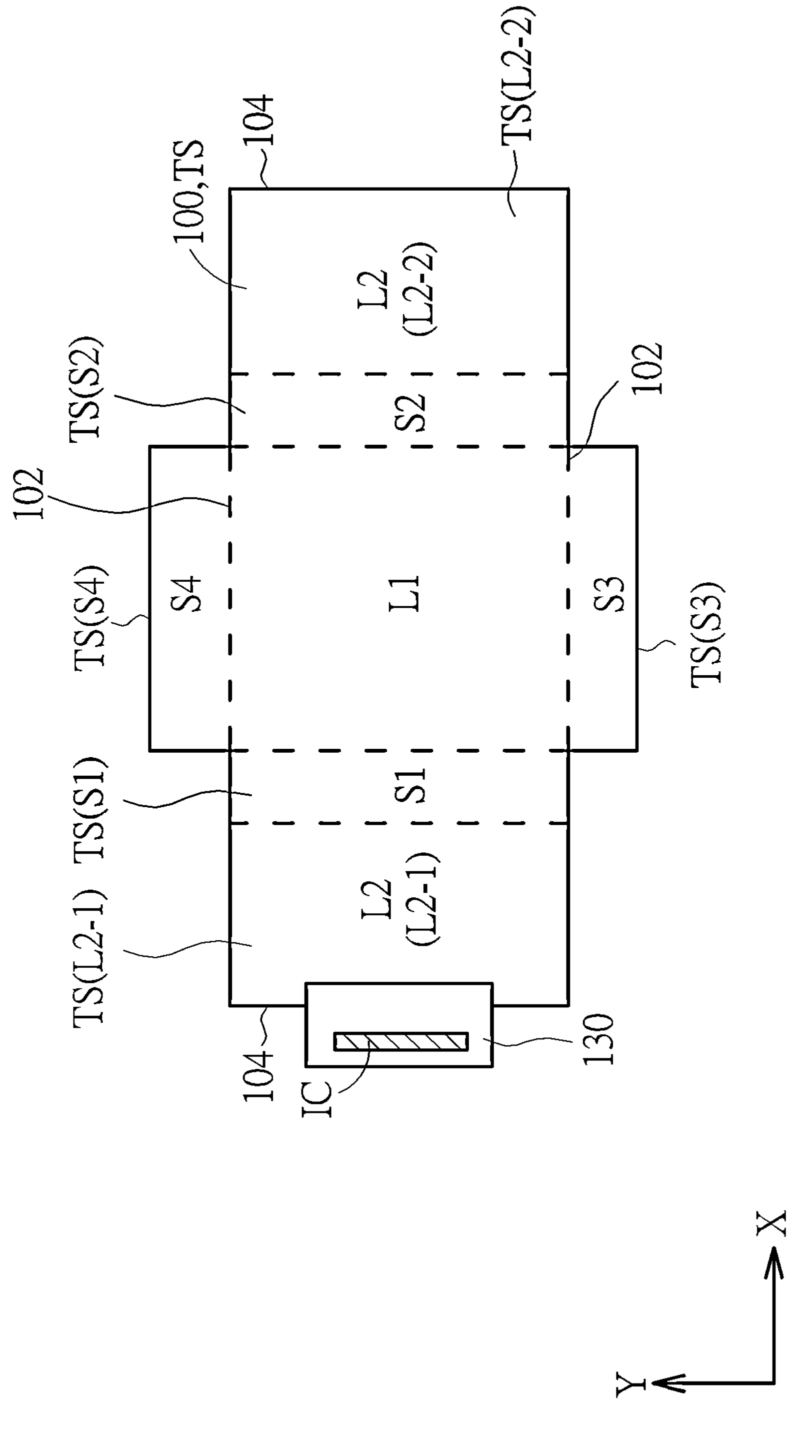
FIG. 2B is a schematic plan view showing a display panel and a flexible circuit board of a display device in a non-wraparound form according to an embodiment of the disclosure.

Please refer to FIG. 2A and FIG. 2B. FIG. 2A is a schematic diagram showing the structure of a display device 10 according to an embodiment of the disclosure. The display device 10 shown in FIG. 2A includes a display panel 100 in a wraparound form. FIG. 2B is a schematic plan view showing the display panel 100 in a non-wraparound form and a flexible circuit board 130 electrically bonded to an edge of the display panel 100. The difference between the embodiment shown in FIG. 1A and FIG. 1B and the embodiment shown in FIG. 2A and FIG. 2B includes that, the display panel 100 shown in FIG. 2A and FIG. 2B includes a side-extending portion S3 and a side-extending portion S4 respectively disposed at the two wraparound edges 102 of the display panel 100. For example, the side-extending portion S3 and side-extending portion S4 may be respectively disposed at the two wraparound edges 102 of the long-extending portion L1. When the display panel 100 is in the wraparound form as shown in FIG. 2A, the side-extending portion S3 and side-extending portion S4 may respectively be bent toward the back surface (not shown) of the long-extending portion L1. According to some embodiments of the present disclosure, the side-extending portion S3 and the side-extending portion S4 correspond to the two assistant side display regions of the display device 10.

According to some embodiments of the present disclosure, the bent regions of the display panel 100 of the display device 10 and the position of the flexible circuit board 130 bonded to the display panel 100 may be adjusted according to design needs. Please refer to FIG. 3A, FIG. 3B, FIG. 3C and FIG. 3D, which are schematic plan views respectively showing a display panel 100 of a display device and a flexible circuit board 130 bonded to the display panel 100 according to some embodiments of the disclosure.

Figure 3B:
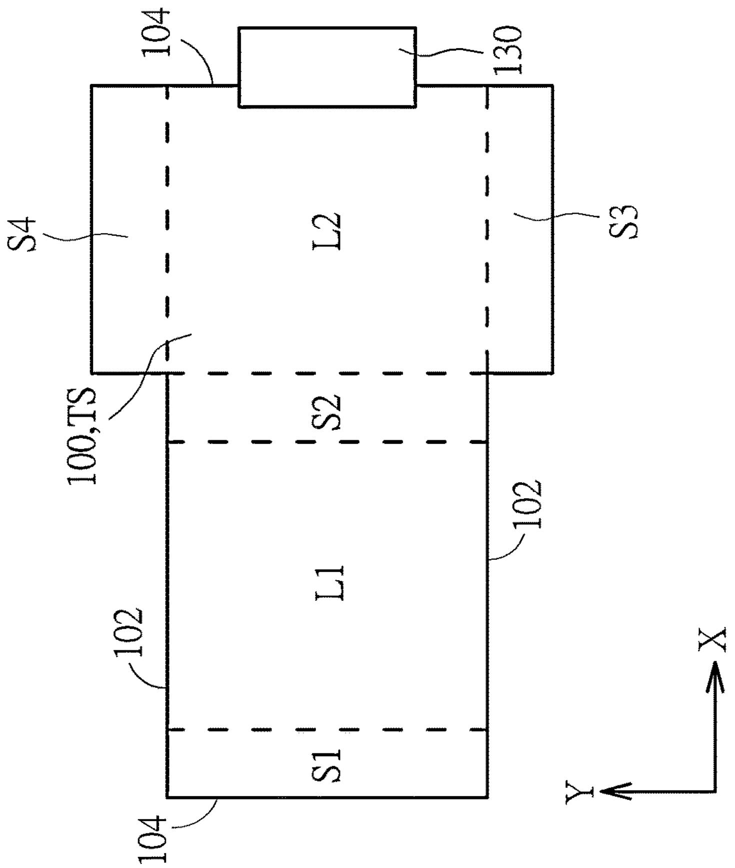
FIG. 3A, FIG. 3B, FIG. 3C and FIG. 3D are schematic plan views respectively showing a display panel and a flexible circuit board of a display device according to some embodiments of the disclosure.
Figure 3A:
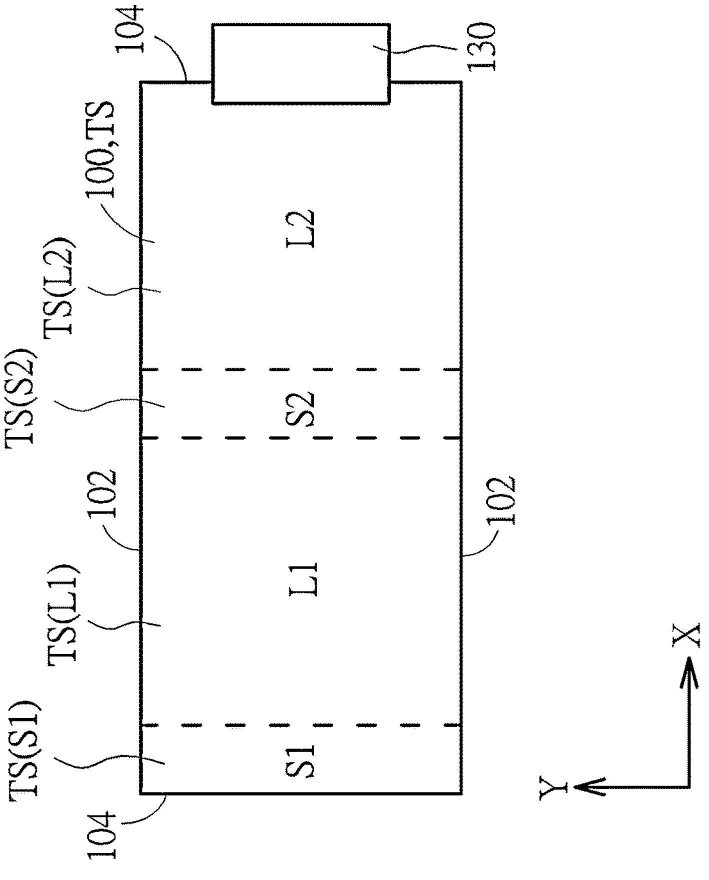

In the embodiment shown in FIG. 3A, the display panel 100 may include a display surface TS, a back surface (not shown) that is opposite to the display surface TS, and two wraparound edges 102 and two non-wraparound edges 104, wherein the two wraparound edges 102 and the two non-wraparound edges 104 surround the display surface TS and the back surface. The difference between the display panel 100 shown in FIG. 3A and the display panel 100 shown in FIG. 1B includes that, the two non-wraparound edges 104 of the display panel 100 shown in FIG. 3A are respectively the edges of the short-extending portion S1 and the long-extending portion L2 of the display panel 100, and the flexible circuit board 130 is electrically bonded to one of the non-wraparound edges 104 of the long-extending portion L2. When the display panel 100 is in a wraparound form, the display surface TS(L1) of the long-extending portion L1 faces toward outside, the back surface (not shown) of the long-extending portion L1 faces toward inside, and the long-extending portion L2 is bent toward the back surface (not shown) of the long-extending portion L1. In other words, when the display panel 100 is in the wraparound form, the back surface (not shown) of the long-extending portion L2 is closer to the back surface (not shown) of the long-extending portion L1 than the display surface TS(L2) of the long-extending portion L2. The short-extending portion S1 is also bent toward the back surface (not shown) of the long-extending portion L1 to encompass the internal space (such as the internal space 110 shown in FIG. 1A) of the display device 10. The flexible circuit board 130 may be bent through a space between the long-extending portion L2 and the short-extending portion S1 and extend into the internal space.

In the embodiment shown in FIG. 3B, different from FIG. 3A, the display panel 100 may further include side-extending portion S3 and side-extending portion S4 respectively disposed at two wraparound edges 102 of the display panel 100. For example, the side-extending portion S3 and side-extending portion S4 may be respectively disposed at the two wraparound edges 102 of the long-extending portion L2. When the display panel 100 is in the wraparound form, the side-extending portion S3 and side-extending portion S4 may respectively be bent toward the back surface (not shown) of the long-extending portion L2. According to some embodiments of the present disclosure, the side-extending portion S3 and the side-extending portion S4 correspond to the two assistant side display regions.

Figure 3D:
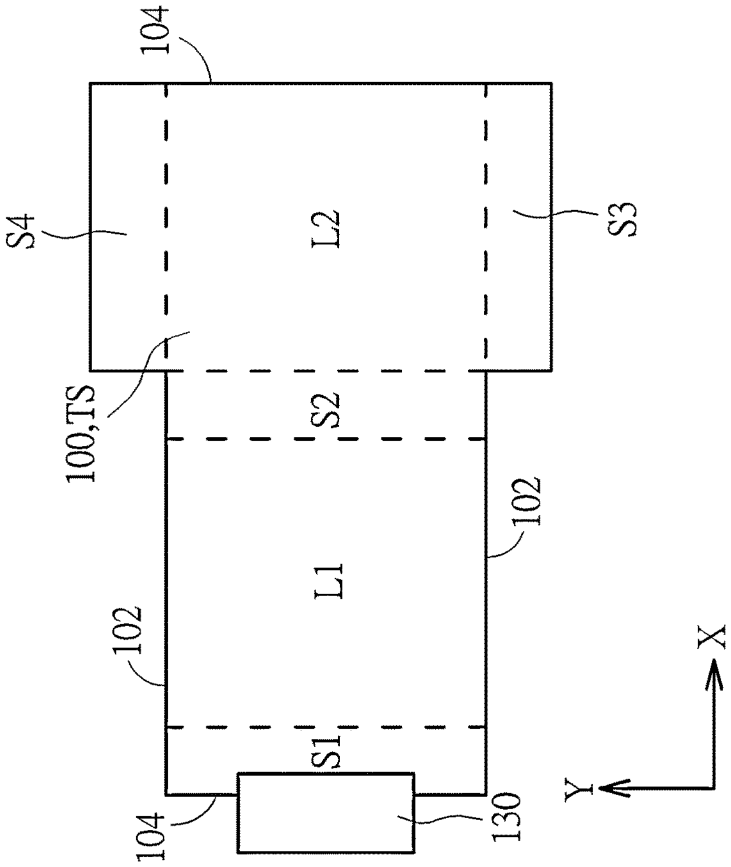
Figure 3C:
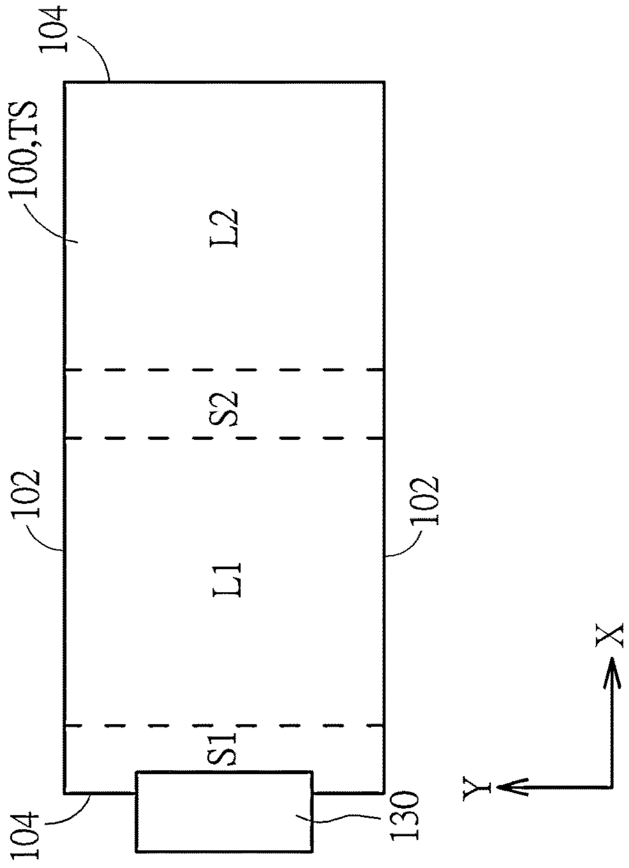

In the embodiment shown in FIG. 3C, the display panel 100 includes a display surface TS, a back surface (not shown) that is opposite to the display surface TS, two wraparound edges 102 and two non-wraparound edges 104, wherein the two wraparound edges 102 and the two non-wraparound edges 104 surround the display surface TS and the back surface together. The difference between the display panel 100 shown in FIG. 3C and the display panel 100 shown in FIG. 1B includes that, the two non-wraparound edges 104 of the display panel 100 shown in FIG. 3C are respectively the edges of the short-extending portion S1 and the long-extending portion L2 of the display panel 100, and the flexible circuit board 130 is bonded to the non-wraparound edge 104 of the short-extending portion S1. When the display panel 100 is in a wraparound form, the long-extending portion L2 is bent toward the back surface (not shown) of the long-extending portion L1. The short-extending portion S1 is also bent toward the back surface (not shown) of the long-extending portion L1 to encompass the internal space (such as the internal space 110 shown in FIG. 1A) of the display device 10. The flexible circuit board 130 may be bent through a space between the long-extending portion L2 and the short-extending portion S1 and extend into the internal space.

In the embodiment shown in FIG. 3D, different from FIG. 3C, the display panel 100 may further include side-extending portion S3 and side-extending portion S4 respectively disposed at two wraparound edges 102 of the display panel 100. For example, the side-extending portion S3 and side-extending portion S4 may be respectively disposed at the two wraparound edges 102 of the long-extending portion L2. When the display panel 100 is in the wraparound form, the side-extending portion S3 and side-extending portion S4 may respectively be bent toward the back surface (not shown) of the long-extending portion L2. According to some embodiments of the present disclosure, the side-extending portion S3 and the side-extending portion S4 correspond to the two assistant side display regions.

According to some embodiments of the present disclosure, the position of the flexible circuit board 130 in the internal space 100 may be adjusted according to design needs. Please refer to FIG. 4, FIG. 5 and FIG. 6, which are schematic diagrams respectively showing a structure of a display device 10 including a display panel 100 and a flexible circuit board 130 according to some embodiments of the disclosure.

Figure 4:
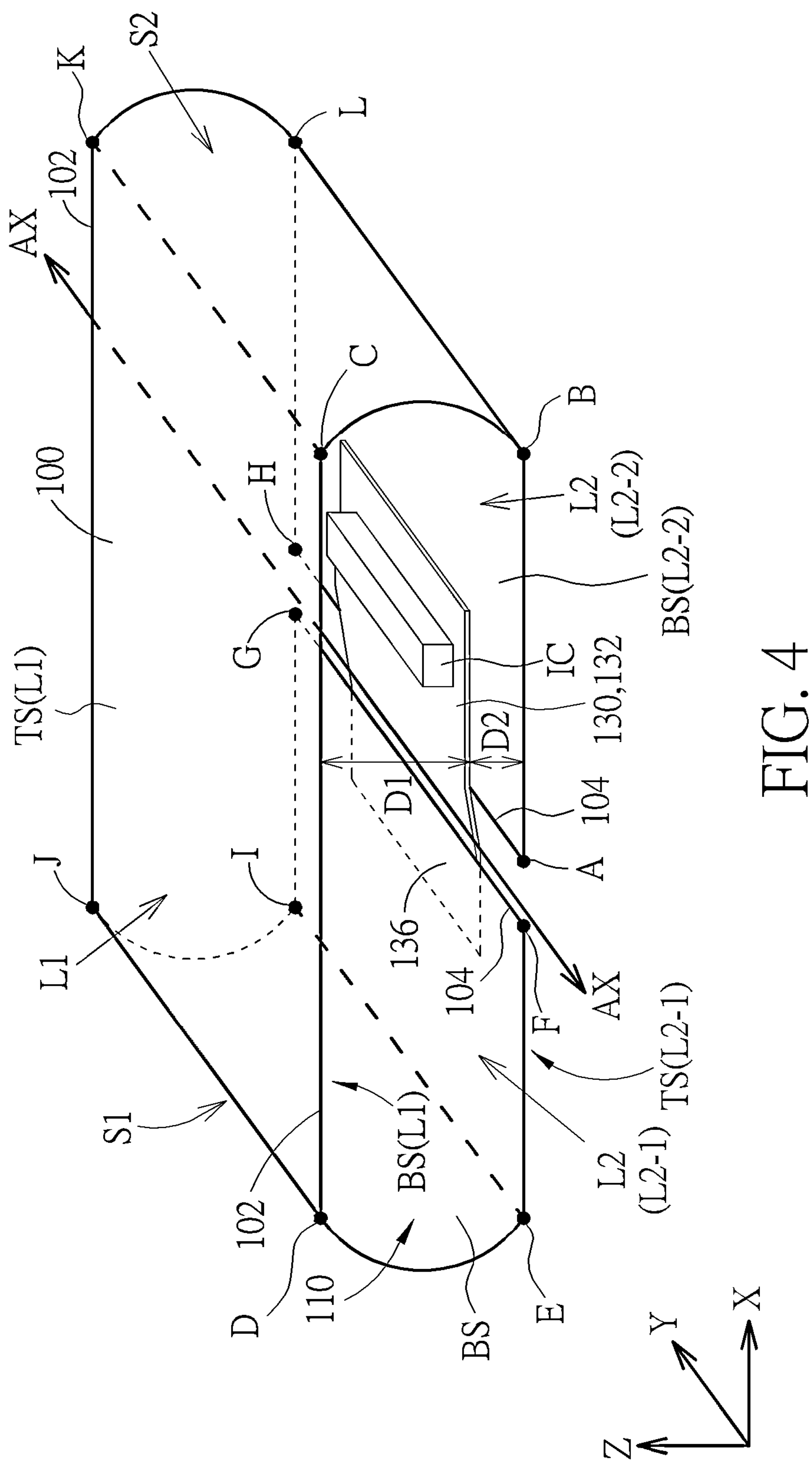
FIG. 4, FIG. 5 and FIG. 6 are schematic diagrams respectively showing a structure of a display device according to some embodiments of the disclosure.

In the embodiment shown in FIG. 4, the display panel 100 may be similar to the display panel shown in FIG. 1B and includes a display surface TS, a back surface (not shown) that is opposite to the display surface TS, two wraparound edges 102 and two non-wraparound edges 104, wherein the two wraparound edges 102 and the two non-wraparound edges 104 surround the display surface TS and the back surface together. One of the two wraparound edges 102 may include the edge between point A and point B, the edge between point B and point C, the edge between point C and point D, the edge between point D and point E, and the edge between point E and point F. The other one of the two wraparound edges 102 may include the edge between point G and point I, the edge between point I and point J, the edge between point J and point K, the edge between point K and point L, and the edge between point L and point H. The two non-wraparound edges 104 may respectively include the edge between point G and point F and the edge between point H and point A. The two non-wraparound edges 104 are respectively the edge of the long-extending portion L2-1 and the edge of the long-extending portion L2-2. The flexible circuit board 130 is bonded to the non-wraparound edge 104 of the long-extending portion L2-1. When the display panel 100 is in the wraparound form, the long-extending portion L2-1 and the long-extending portion L2-2 are bent toward the back surface BS(L1) of the long-extending portion L1 in such a way that the long-extending portion L2-1 and the long-extending portion L2-2 are close to each other but do not overlap. The flexible circuit board 130 is bonded to the display surface TS(L2-1) of the long-extending portion L2-1 and extends through the space between the long-extending portion L2-1 and the long-extending portion L2-2 into the internal space 110, and extends along the back surface BS(L2-2) of the long-extending portion L2-2 to overlap the long-extending portion L2-2 on the Z direction. As shown in FIG. 4, a surface (such as the surface 132 shown in FIG. 1B)) of the flexible circuit board 130 may be spaced apart from the back surface BS(L1) of the long-extending portion L1 by a maximum distance D1 on the Z direction, and may be spaced apart from the back surface BS(L2-2) of the long-extending portion L2-2 by a maximum distance D2 on the Z direction. When the maximum distance D2 is smaller than the maximum distance D1, a larger portion of the internal space 110 may be reserved to accommodate other components of the display device 10 (such as a battery and/or a control board). A higher utilization rate of the internal space 110 may be achieved. The circuit component IC may be disposed on the surface 132 of the flexible circuit board 130 and exposed in the internal space 110, which is beneficial for heat dissipation of the circuit component IC. According to some embodiments of the present disclosure, the flexible circuit board 130 may be fixed on the back surface BS(L2-2) of the long-extending portion L2-2 through an adhesive layer, but it is not limited thereto.

Figure 5:
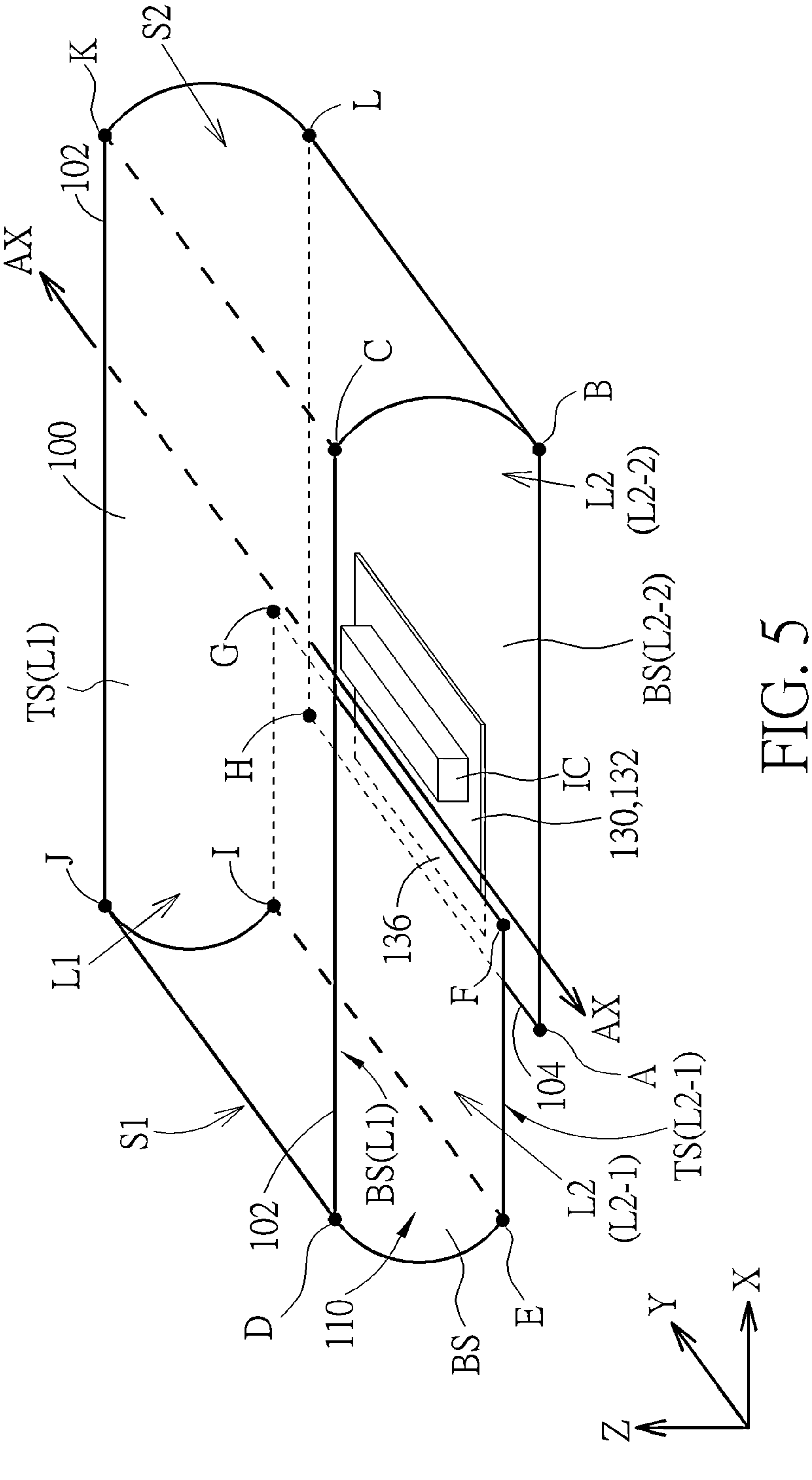

In the embodiment shown in FIG. 5, the display panel 100 may be similar to the display panel shown in FIG. 1B and includes a display surface TS, a back surface (not shown) that is opposite to the display surface TS, two wraparound edges 102 and two non-wraparound edges 104, wherein the two wraparound edges 102 and the two non-wraparound edges 104 surround the display surface TS and the back surface together. The two non-wraparound edges 104 are respectively the edge of the long-extending portion L2-1 and the edge of the long-extending portion L2-2. The flexible circuit board 130 is bonded to the non-wraparound edge 104 of the long-extending portion L2-1. When the display panel 100 is in the wraparound form, the long-extending portion L2-1 and the long-extending portion L2-2 are bent toward the back surface BS(L1) of the long-extending portion L1 in such a way that the long-extending portion L2-1 and the long-extending portion L2-2 partially overlap with each other on the Z direction. According to some embodiments of the present disclosure, the long-extending portion L2-2 overlaps at least a portion of the bonding region 136 of the flexible circuit board 130. When the long-extending portion L2-1 and the long-extending portion L2-2 are at least partially overlapped on the Z direction, an all-around (surrounding 360 degrees around the surrounding axis AX) display effect may be achieved. The flexible circuit board 130 is electrically bonded to the display surface TS(L2-1) of the long-extending portion L2-1 and extends through the space between the long-extending portion L2-1 and the long-extending portion L2-2 into the internal space 110, and extends along the back surface BS(L2-2) of the long-extending portion L2-2 to overlap the long-extending portion L2-2 on the Z direction. According to some embodiments of the present disclosure, the flexible circuit board 130 may be fixed on the back surface BS(L2-2) of the long-extending portion L2-2 through an adhesive layer, but it is not limited thereto. The circuit component IC may be disposed on the surface 132 of the flexible circuit board 130 and exposed in the internal space 110, which is beneficial for heat dissipation of the circuit component IC.

Figure 6:
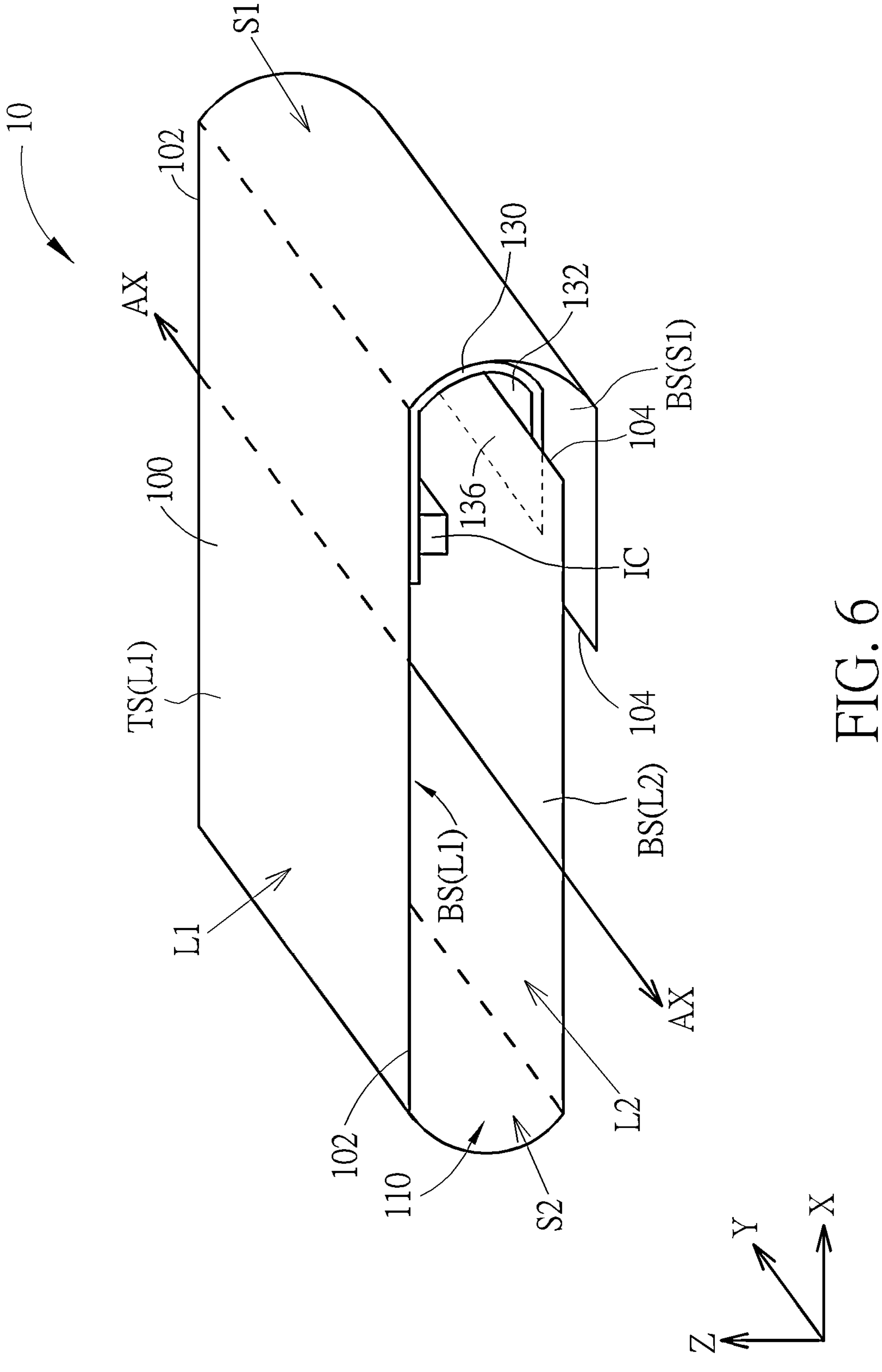

In the embodiment shown in FIG. 6, the display panel 100 may be similar to the display panel shown in FIG. 3A when the display panel 100 is in a non-wraparound form. The display panel 100 shown in FIG. 6 includes a display surface TS, a back surface (not shown) that is opposite to the display surface TS, two wraparound edges 102 and two non-wraparound edges 104, wherein the two wraparound edges 102 and the two non-wraparound edges 104 surround the display surface TS and the back surface together. The two non-wraparound edges 104 are respectively the edges of the long-extending portion L2 and the short-extending portion S1. The flexible circuit board 130 is bonded to the non-wraparound edge 104 of the long-extending portion L2 through the bonding region 136 of the flexible circuit board 130. When the display panel 100 is in the wraparound form, the long-extending portion L2 and the short-extending portion S1 are bent toward the back surface BS(L1) of the long-extending portion L1 to encompass the internal space 110 of the display device 10. The flexible circuit board 130 extends through the space between the long-extending portion L2 and the short-extending portion S1 into the internal space 110, and extends along the back surface BS(S1) of the short-extending portion S1 to overlap the short-extending portion S1 on the X direction. According to some embodiments of the present disclosure, the flexible circuit board 130 may be fixed on the back surface BS(S1) of the short-extending portion S1 through an adhesive layer, but it is not limited thereto. The circuit component IC may be disposed on the surface 132 of the flexible circuit board 130 and exposed in the internal space 110, which is beneficial for heat dissipation of the circuit component IC. The embodiment shown in FIG. 6 may achieve a substantially seamless display region having a high screen-to-body ratio.

Figure 7A:
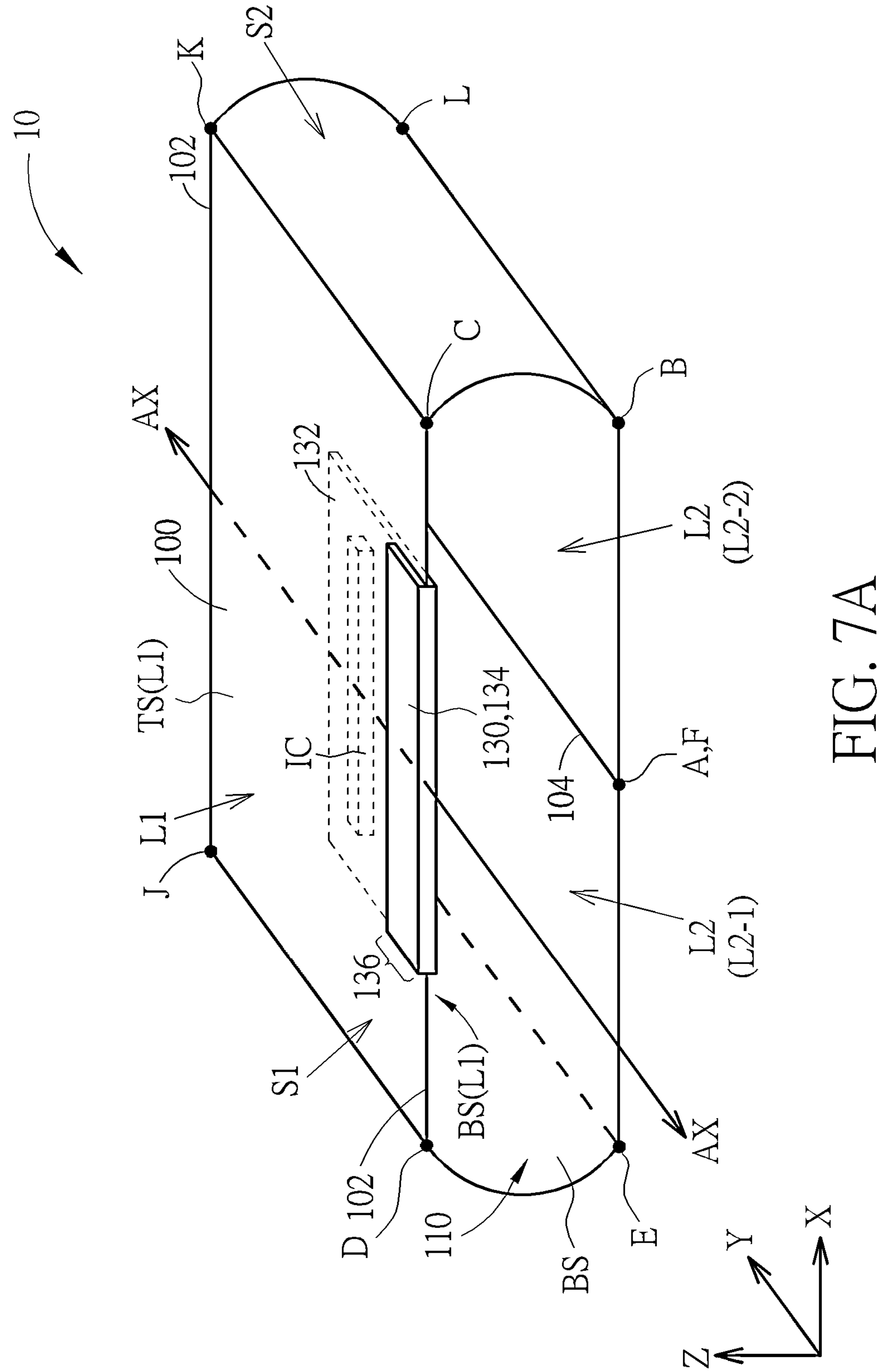
FIG. 7A is a schematic diagram showing the structure of a display device according to an embodiment of the disclosure.
Figure 7B:
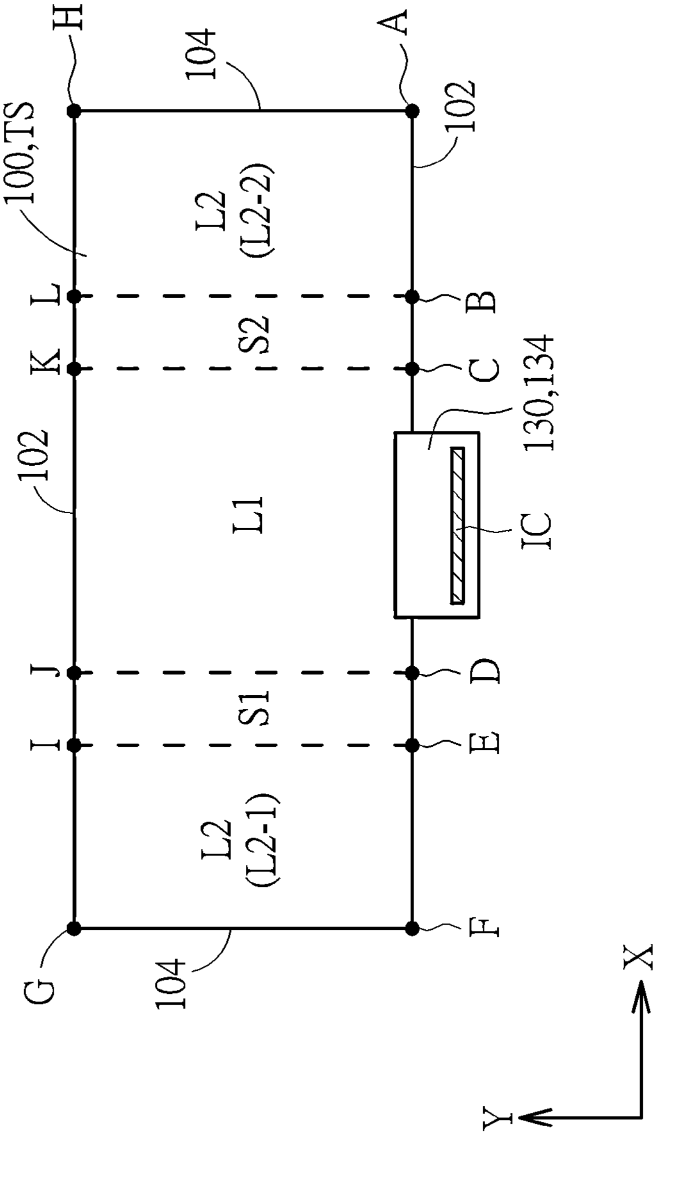
FIG. 7B is a schematic plan view showing a display panel and a flexible circuit board of a display device in a non-wraparound form according to an embodiment of the disclosure.

Please refer to FIG. 7A and FIG. 7B. FIG. 7A is a schematic diagram showing the structure of a display panel 100 and a flexible circuit board 130 of a display device 10 according to an embodiment of the disclosure. FIG. 7B is a schematic plan view showing the display panel 100 and the flexible circuit board 130 of the display device 10 in a non-wraparound form according to an embodiment of the disclosure. The difference between the embodiment shown in FIG. 7A, FIG. 7B and the embodiment shown in FIG. 1A, FIG. 1B includes that, the flexible circuit board 130 of a display device 10 shown in FIG. FIG. 7A, FIG. 7B is electrically bonded to one of the wraparound edges 102 of the display panel 100 through the bonding region 136 of the flexible circuit board 130 for driving the display panel 100.

As shown in FIG. 7A and FIG. 7B, the display panel 100 of the display device 10 may be, for example, a flexible display panel. The display panel 100 may include a display surface TS, a back surface (not shown) that is opposite to the display surface TS, two wraparound edges 102 opposite to each other and two non-wraparound edges 104 opposite to each other, wherein the two wraparound edges 102 and the two non-wraparound edges 104 surround the display surface TS and the back surface together. The display panel 100 may be divided into a long-extending portion L1, a long-extending portion L2 including a long-extending portion L2-1 and a long-extending portion L2-2, a short-extending portion S1 between the long-extending portion L1 and the long-extending portion L2-1, and a short-extending portion S2 between the long-extending portion L1 and the long-extending portion L2-2. The two non-wraparound edges 104 are respectively the edges of the edge of the long-extending portion L2-1 and the edge of the long-extending portion L2-2. That is, the two non-wraparound edges 104 are respectively the edge between the point G and the point F and the edge between the point A and the point H. One of the two wraparound edges 102 may include the edge between point A and point B, the edge between point B and point C, the edge between point C and point D, the edge between point D and point E, and the edge between point E and point F. The other one of the two wraparound edges 102 may include the edge between point G and point I, the edge between point I and point J, the edge between point J and point K, the edge between point K and point L, and the edge between point L and point H. The flexible circuit board 130 is bonded to one of the two wraparound edges 102. For example, the flexible circuit board 130 is electrically bonded to the edge between the point C and the point D of the wraparound edges 102 of the long-extending portion L1. The flexible circuit board 130 electrically is bonded to the display panel 100 through the bonding region 136 and may overlap at least a portion of the wraparound edges 102 of the long-extending portion L1 on the Z direction. When the display panel 100 is in the wraparound form, the long-extending portion L2-1 and the long-extending portion L2-2 are bent toward the back surface BS(L1) of the long-extending portion L1. The bent long-extending portion L2-1 and long-extending portion L2-2 may be joint together or at least partially overlapped on the Z direction, or may be completely non-overlapped with each other on the Z direction. When the long-extending portion L2-1 and long-extending portion L2-2 are at least partially overlapped on the Z direction, an all-around (surrounding 360 degrees around the surrounding axis AX) display effect may be achieved. According to some embodiments, the flexible circuit board 130 may be attached to one of the two long-extending portions through at least a portion of a surface of the flexible circuit board 130, for example, the flexible circuit board 130 may be bonded to the display surface TS(L1) of the long-extending portion L1 and the flexible circuit board 130 may be bent into the internal space 110 in such a way that the surface 132 of the flexible circuit board 130 faces the back surface BS(L1) of the long-extending portion L1. The circuit component IC disposed on the surface 134 of the flexible circuit board 130 is exposed in the internal space 110. According to some embodiments of the present disclosure, an adhesive layer may be provided between the surface 132 of the flexible circuit board 130 and the back surface BS(L1) of the long-extending portion L1 to fix the flexible circuit board 130 on the back surface BS(L1) of the long-extending portion L1.

According to some embodiments of the present disclosure, the shape of the flexible circuit board 130 may be adjusted according to design needs. Please refer to FIG. 8A, FIG. 8B and FIG. 8C, which are schematic plan views respectively showing a display panel and a flexible circuit board of a display device according to some embodiments of the disclosure.

Figure 8B:
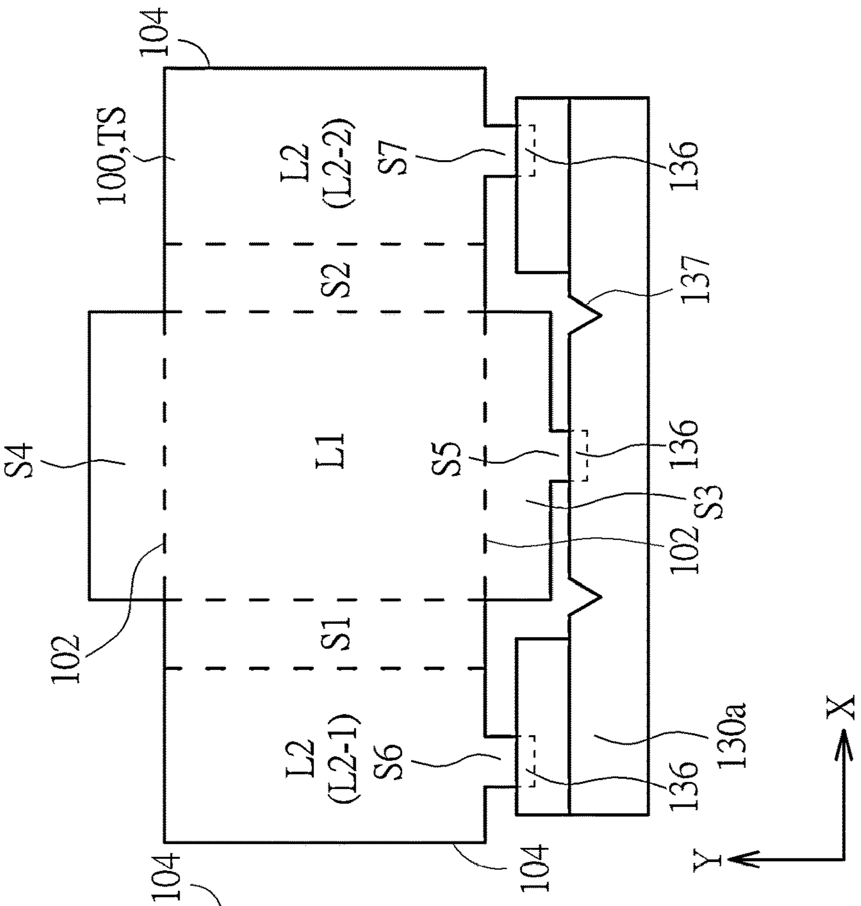
FIG. 8A, FIG. 8B and FIG. 8C are schematic plan views respectively showing a display panel and a flexible circuit board of a display device according to some embodiments of the disclosure.
Figure 8A:
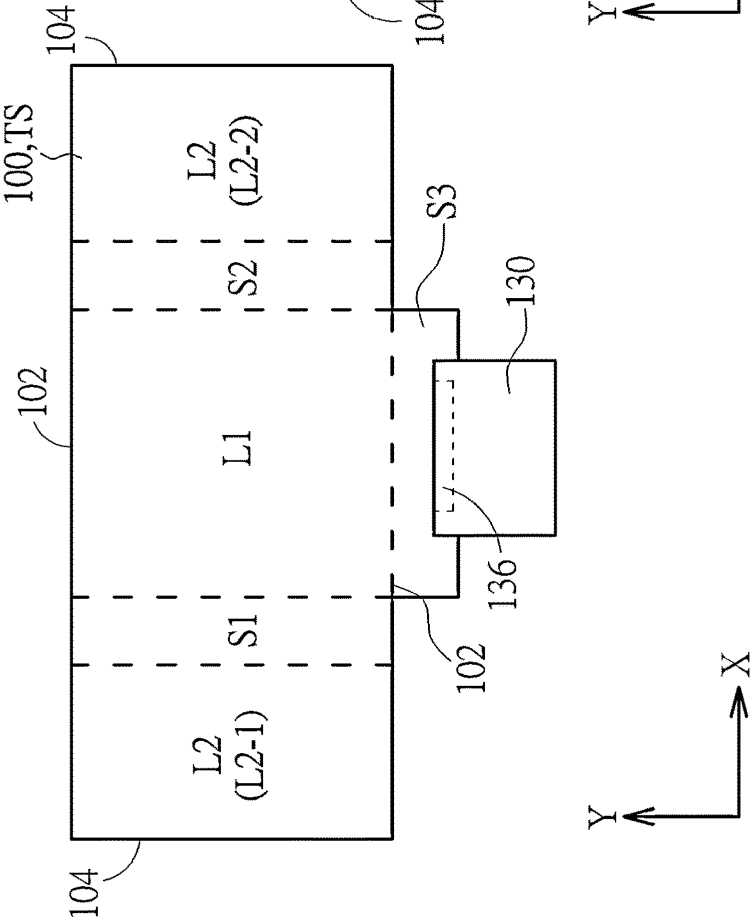

In the embodiment shown in FIG. 8A, the display panel 100 may include a side-extending portion S3. The side-extending portion S3 extends from the wraparound edges 102 of the long-extending portion L1 along the negative Y direction. The flexible circuit board 130 is electrically bonded to the wraparound edges 102 of the display panel 100 through the side-extending portion S3 to drive the display panel 100. When the display panel 100 is in a wraparound form, the side-extending portion S3 may be bent toward the back surface (not shown) of the long-extending portion L1 to make the flexible circuit board 130 positioned at the back surface (not shown) of the long-extending portion L1.

In the embodiment shown in FIG. 8B, the display panel 100 may include a side-extending portion S3 and a side-extending portion S4 respectively on the two wraparound edges 102 at two sides of the long-extending portion L1. The side-extending portion S3 extends from the wraparound edges 102 of the long-extending portion L1 along the negative Y direction, and the ide-extending portion S4 extends from the wraparound edges 102 of the long-extending portion L1 along the positive Y direction. The display panel 100 may further include a flap portion S5 that connects the side-extending portion S3, a flap portion S6 that connects the long-extending portion L2-1, and a flap portion S7 that connects the long-extending portion L2-2. The peripheral of the flexible circuit board 130*a* may include a plurality of bonding regions 136 that are respectively electrically connected to the side-extending portion S3, the long-extending portion L2-1 and the long-extending portion L2-2 through the flap portion S5, the flap portion S6 and the flap portion S7 to drive the display panel 100. When the display panel 100 is in a wraparound form, the side-extending portion S3, the flap portion S5, the flap portion S6, and the flap portion S7 may be bent toward the back surface (not shown) of the display panel 100 to make the flexible circuit board 130*a* positioned at the back surface (not shown) of the display panel 100. According to some embodiments of the present disclosure, the flexible circuit board 130*a* may include cuts 137 to increase the flexibility. According to some embodiments of the present disclosure, when the flexible circuit board 130*a* is positioned at the back surface (not shown) of the display panel 100, the positions of the cuts 137 of the flexible circuit board 130*a* may correspond to the short-extending portion S1 and the short-extending portion S2.

Figure 8C:
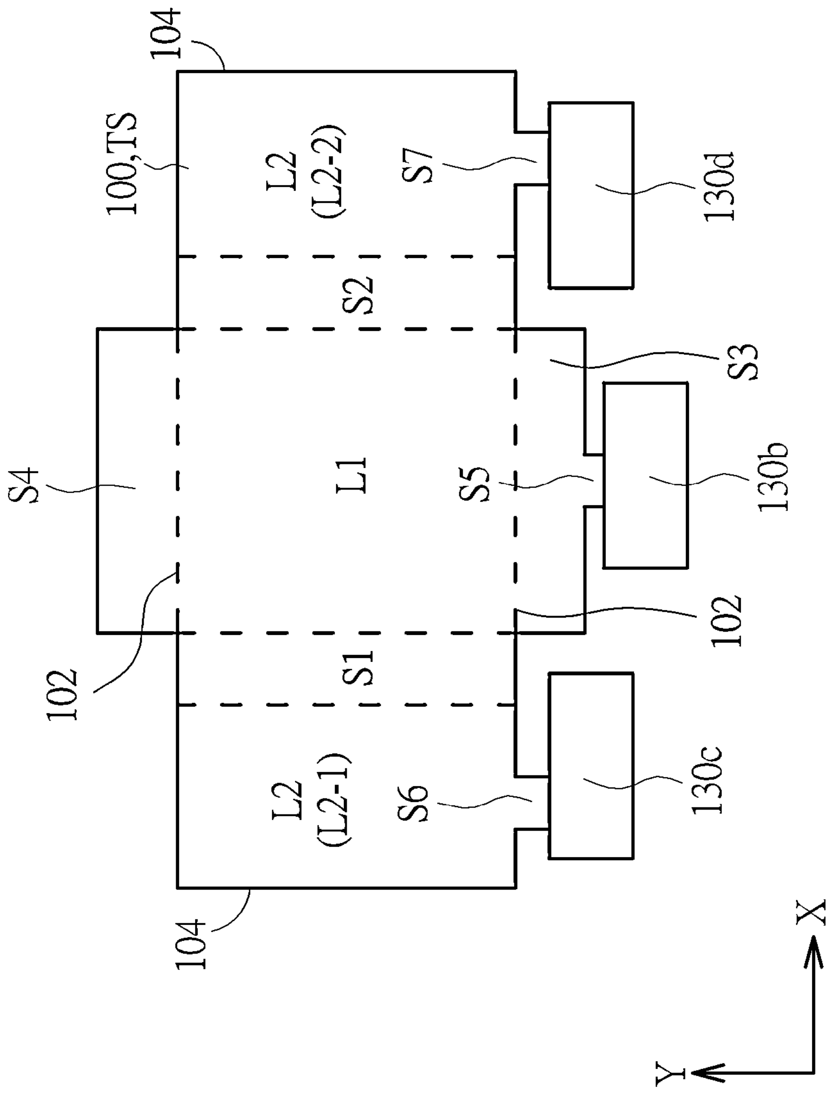

In the embodiment shown in FIG. 8C, the display panel 100 may include a side-extending portion S3 and a side-extending portion S4 respectively disposed at the two wraparound edges 102 of the long-extending portion L1. The display panel 100 further includes a flap portion S5 that connects the side-extending portion S3, a flap portion S6 that connects the long-extending portion L2-1, and a flap portion S7 that connects the long-extending portion L2-2. The flexible circuit board 130*b*, the flexible circuit board 130*c* and the flexible circuit board 130*d* are respectively connected to the side-extending portion S3, the long-extending portion L2-1 and the long-extending portion L2-2 through the flap portion S5, the flap portion S6 and the flap portion S7 to drive the display panel 100.

Figure 9:
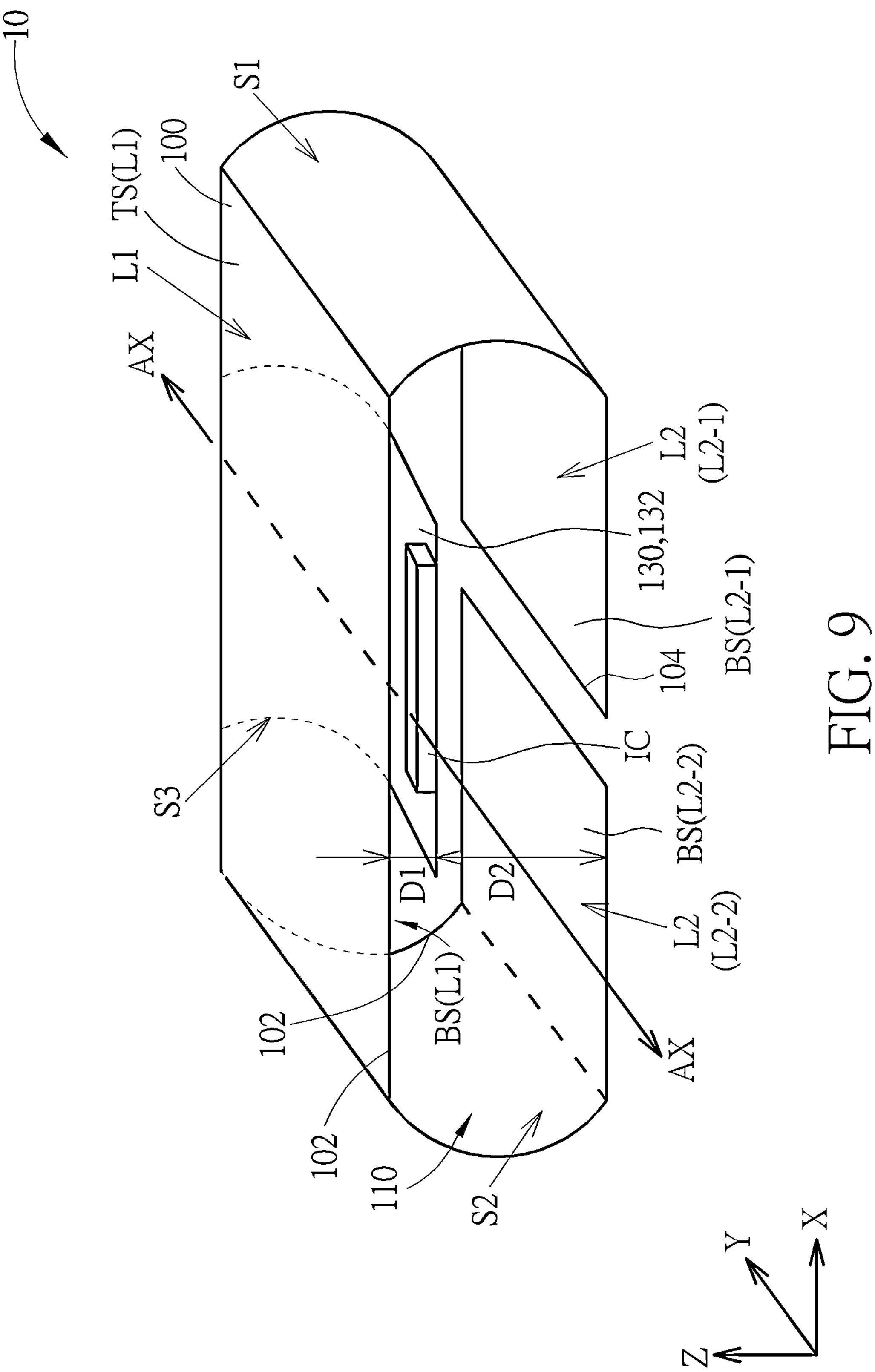
FIG. 9 is a schematic diagram showing the structure of a display device according to an embodiment of the disclosure.
Figure 10:
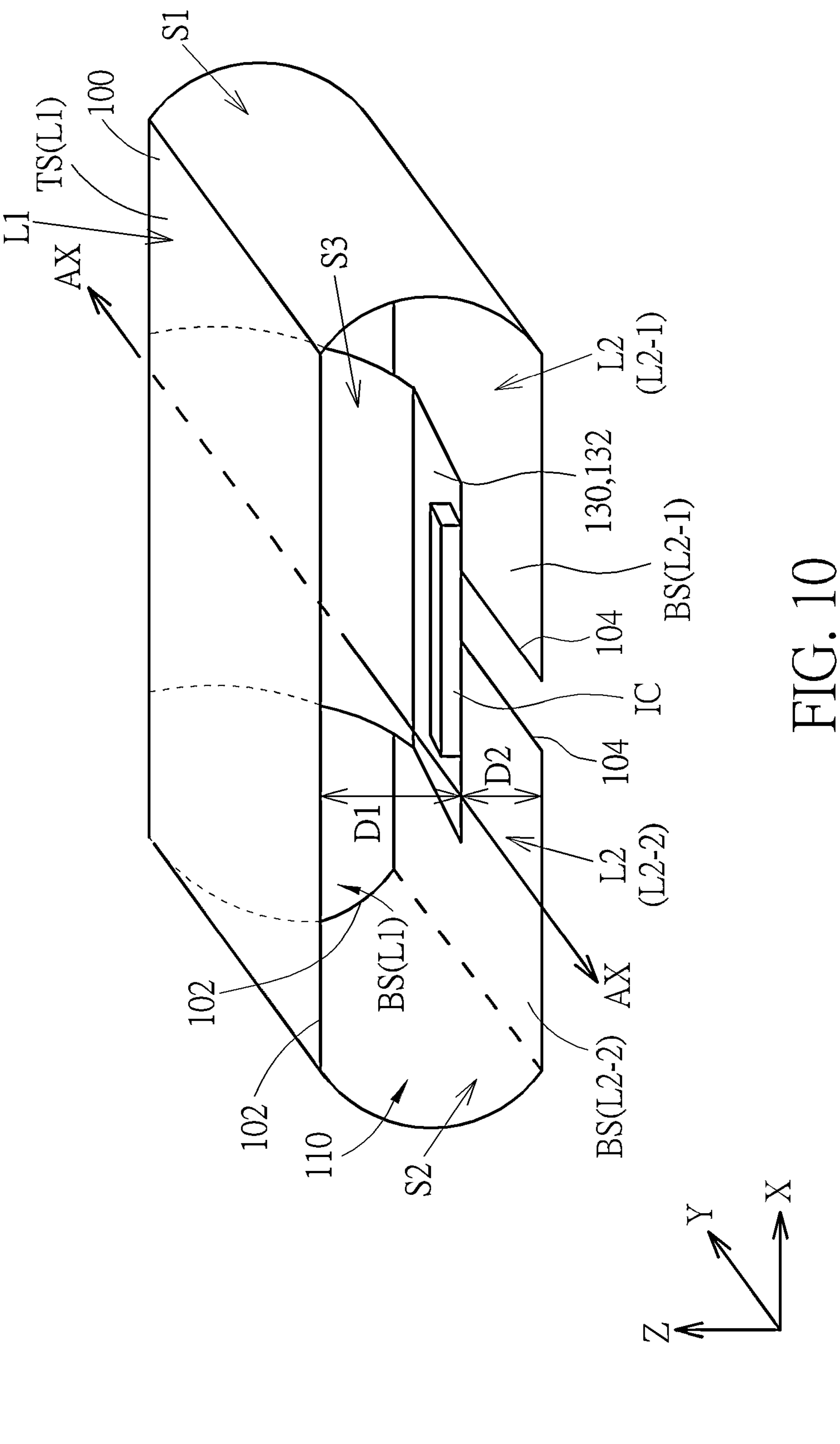
FIG. 10 is a schematic diagram showing the structure of a display device according to an embodiment of the disclosure.

Please refer to FIG. 9 and FIG. 10, which are schematic diagrams respectively showing the structure of a display panel 100 and a flexible circuit board 130 of a display device 10 according to some embodiments of the disclosure. As shown in FIG. 9 and FIG. 10, the display device 10 includes the display panel 100, and the display panel 100 may be a flexible display panel. The display panel 100 may include a display surface TS, a back surface BS opposite to the display surface TS, two wraparound edges 102 and two non-wraparound edges 104. The two wraparound edges 102 and the two non-wraparound edges 104 surround the display surface TS and the back surface BS.

The display panel 100 may be divided into a long-extending portion L1, a long-extending portion L2 that includes a long-extending portion L2-1 and a long-extending portion L2-2, a short-extending portion S1 between the long-extending portion L1 and the long-extending portion L2-1, and a short-extending portion S2 between the long-extending portion L1 and the long-extending portion L2-2. The two non-wraparound edges 104 are respectively the edge of the long-extending portion L2-1 and the edge of the long-extending portion L2-2. The display panel 100 may include a side-extending portion S3 on the wraparound edge 102 at one side of the long-extending portion L1. The flexible circuit board 130 may be electrically bonded to the wraparound edge 102 through the side-extending portion S3 to drive the display panel 100. As shown in FIG. 9 and FIG. 10, when the display panel 100 is in a wraparound form, the side-extending portion S3 may be bent toward the back surface BS(L1) of the long-extending portion L1 to make the flexible circuit board 130 positioned in the internal space 110. A surface (such as the surface 132 shown in FIG. 1B)) of the flexible circuit board 130 may be spaced apart from the back surface BS(L1) of the long-extending portion L1 by a maximum distance D1 on the Z direction, and may be spaced apart from the back surface BS(L2-2) of the long-extending portion L2-2 (or the back surface BS(L2-1) of the long-extending portion L2-1) by a maximum distance D2 on the Z direction.

The difference between the embodiments shown in FIG. 9 and FIG. 10 includes that, in the wraparound form of the display panel 100, the side-extending portion S3 in FIG. 9 has a smaller bending radius to make the flexible circuit board 130 closer to the back surface BS(L1) of the long-extending portion L1 and be fixed. In other words, in FIG. 9, the maximum distance D1 is smaller than the maximum distance D2. On the contrary, the side-extending portion S3 in FIG. 10 has a larger bending radius to make the flexible circuit board 130 closer to the back surface BS(L2-2) of the long-extending portion L2-2 (or the back surface BS(L2-1) of the long-extending portion L2-1) and be fixed. In other words, in FIG. 10, the maximum distance D1 is larger than the maximum distance D2. By making the flexible circuit board 130 closer to either the back surface BS(L1) of the long-extending portion L1 or the back surface BS(L2-2) of the long-extending portion L2-2 (or the back surface BS(L2-1) of the long-extending portion L2-1), a larger portion of the internal space 110 may be reserved to accommodate other components of the display device 10 (such as a battery and/or a control board). A higher utilization rate of the internal space 110 may be achieved. According to some embodiments of the present disclosure, the side-extending portion S3 of FIG. 10 may display images and be used as an assistant side display region of the display device 10.

Figure 11:
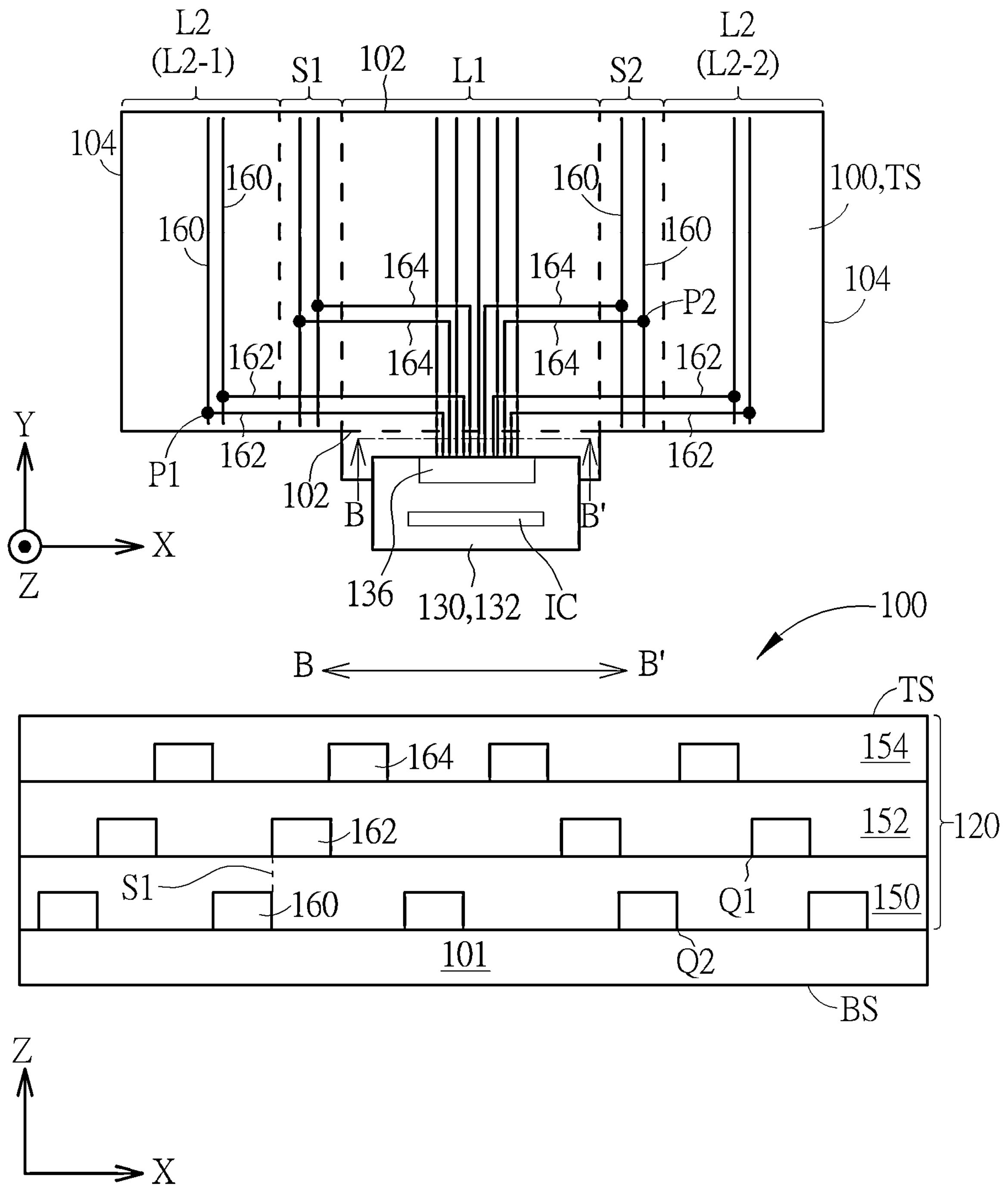
FIG. 11 is a schematic diagram showing a display panel and a flexible circuit board of a display device in a non-wraparound form according to an embodiment of the disclosure.

Please refer to FIG. 11, which is a schematic diagram showing a display panel 100 and a flexible circuit board 10 of a display device 10 in a non-wraparound form according to an embodiment of the disclosure. The upper portion of FIG. 11 is a plan view, and the lower portion of FIG. 11 is a cross-sectional view of the display panel 100 along line B-B' shown in the plan view. The display panel 100 may be a flexible display panel and include a display surface TS, a back surface BS opposite to the display surface TS, two wraparound edges 102 and two non-wraparound edges 104. The flexible circuit board 130 is bonded to one of the wraparound edges 102 of the display panel 100. The display panel 100 may include a thin-film-transistor (TFT) substrate or a circuit board, but is not limited thereto. According to some embodiments of the present disclosure, the display panel 100 may include a substrate 101 and a circuit structure layer 120 disposed on the substrate 101. According to some embodiments of the present disclosure, the circuit structure layer 120 may include light emitting components, optical layers and/or covering layer disposed on the circuit structure layer 120. For the sake of simplicity, the above components are not shown in the diagram.

According to some embodiments of the present disclosure, the substrate 101 is used to carry the pixel array of the display panel 100. According to some embodiments of the present disclosure, the substrate 101 may be flexible substrate. A supporting layer (not shown) or a protecting layer (not shown) may be provided on the back side of the substrate 101.

The circuit structure layer 120 is disposed on the front side of the substrate 101 and may include multiple layers including driving circuit components and circuit wires or signal lines (such as transistors, capacitors, data lines, scan lines, light-emitting control lines, power lines, ground potential lines, and fan-out circuits, or other electrical components) to control the display units of the display panel 100. To simplify the description, only the lines 160 that are perpendicular to the wraparound edges 102 are shown in FIG. 11 for illustration. For example, the lines 160 shown in FIG. 11 may be data lines, but is not limited thereto. The lines 160 extend along the Y direction and are arranged on the substrate 101 corresponding to the long-extending portion L2-1, the short-extending portion S1, the long-extending portion L1, the short-extending portion S2, and the long-extending portion L2-2 of the display panel 100. The bonding region 136 of the flexible circuit board 130 is electrically bonded to the display panel 100 and electrically connected to the lines 160, allowing the circuit component IC on the flexible circuit board 130 to control each of the lines 160. It should be understood that the lines 160 may be other types of control lines, such as scan lines.

Fan-out lines such as lines 162 and lines 164 may be disposed on the substrate 101 to electrically connect the lines 160 and the bonding region 136 of the flexible circuit board 130. According to some embodiments of the present disclosure, the lines 160, the lines 162 and the lines 164 may be formed in different layers of the circuit structure layer 120. For example, as shown in the lower portion of FIG. 11, the circuit structure layer 120 (from lower portion that is closer to the substrate 101 to upper portion that is away from the substrate 101) may include a first insulating layer 150, a second insulating layer 152 and a third insulating layer 154. The lines 160 are disposed between the substrate 101 and the first insulating layer 150. The lines 162 are disposed between the first insulating layer 150 and the second insulating layer 152. The lines 164 are disposed between the second insulating layer 152 and the third insulating layer 154. In this way, the lines 160, the lines 162, and the lines 164 may be at least partially overlapped or substantially aligned on the edges on the Z direction. For example, as shown in FIG. 11, the edges of the lines 160, the lines 162, and the lines 164 may be aligned along the line S1. In this way, the circuit layout flexibility may be increased. In other embodiments, the distances between the lines 160, the lines 162, and the lines 164 formed in different layers of the circuit structure layer 120 on the X direction may be smaller than the distances between the lines 160, the lines 162, and the lines 164 formed in a same layer (such as between the first insulating layer 150 and the second insulating layer 152) of the circuit structure layer 120. In this way, the circuit layout flexibility may be increased. In the embodiment shown in FIG. 11, the distance between the lines 160 and the lines 162 may be the distance between the point Q1 and the point Q2 on the X direction. It should be noted that the sequence of the lines 160, the lines 162 and the lines 164 on the Z direction is not limited to the illustrated embodiment and may be adjusted according to design needs. For example, the lines 160 in FIG. 11 are disposed in the insulating layer below the lines 162 or the lines 164. In other embodiments, the lines 160 may be disposed in the insulating layer above the lines 162 or the lines 164, or the lines 160 may be formed in the insulating layer between the line 162 and the line 164, but are not limited thereto. As shown in the upper portion of FIG. 11, the lines 162 may include segments that extend along the X direction for electrically connecting (through the vias through the first insulating layer 150, such as the vias P1) the lines 160 in the long-extending portion L2-1 and the long-extending portion L2-2. The lines 164 may include segments that extend along the X direction for electrically connecting (through the vias through the first insulating layer 150 and the second insulating layer 152, such as the vias P1) the lines 160 in the short-extending portion S1 and the short-extending portion S2.

Figure 12:
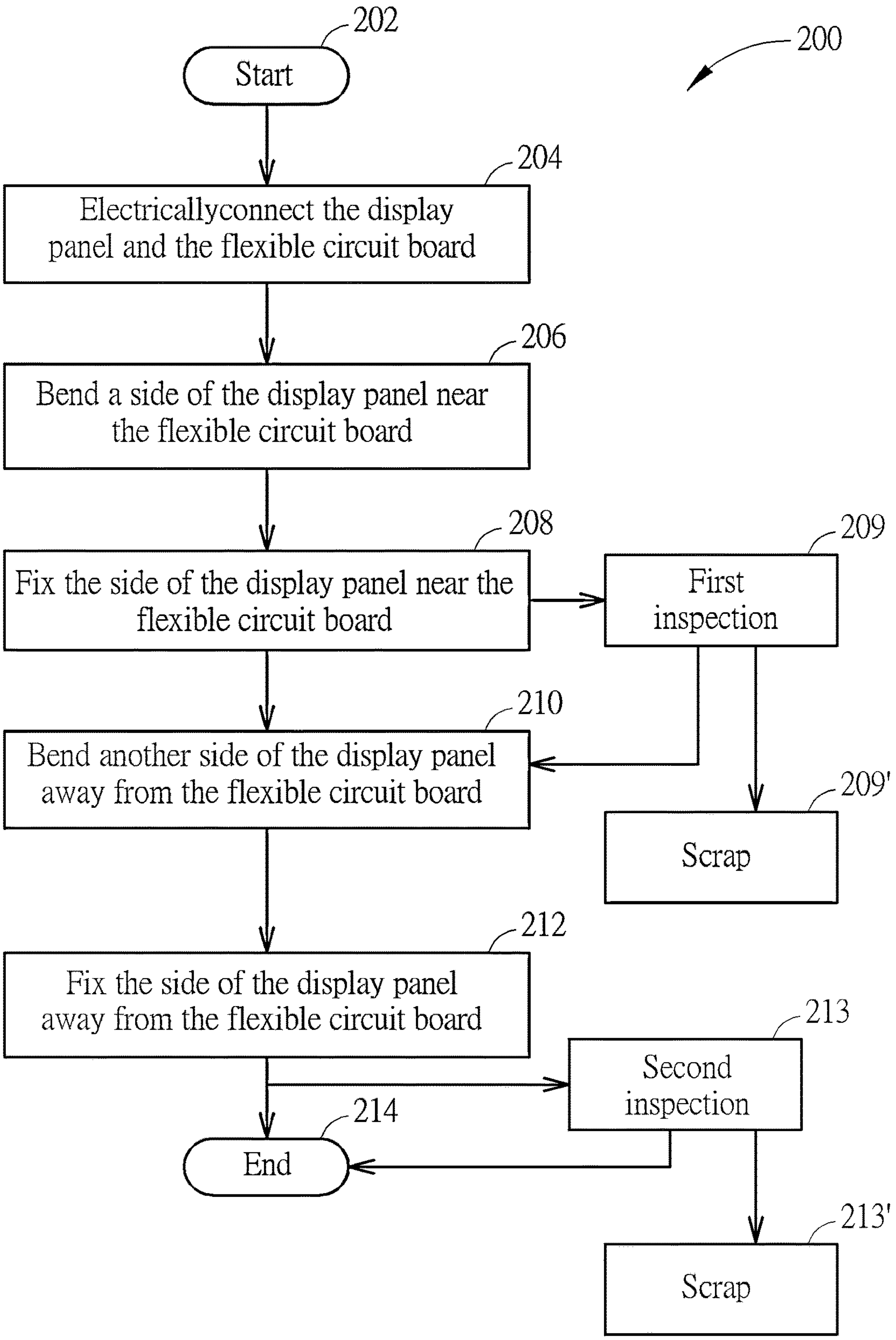
FIG. 12 is a flow chart showing the steps of wrapping a display panel according to an embodiment of the disclosure.

Please refer to FIG. 12, which is a flow chart showing the steps of a wrapping process 200 for wrapping a display panel 100 according to an embodiment of the disclosure. For the ease of understanding, the following description, with reference to FIG. 12, FIG. 1A and FIG. 1B at the same time, will the steps of the wrapping method 200 to wrap a display panel 100 having a flexible circuit board 130 bonded to a non-wraparound edge 104 of the display panel 100.

The wrapping process 200 starts at the step 202. Following, the step 204 is performed to electrically connect the display panel and the flexible circuit board. As shown in FIG. 1B, the flexible circuit board 130 is bonded to one of the non-wraparound edges 104 at one side of the long-extending portion L2-1. Following, the step 206 is performed to bend (first bending step) a side of the display panel where the flexible circuit board is bonded. As shown in FIG. 1A, the short-extending portion S1 is bent in such a way that the wraparound edges 102 surround the surrounding axis AX to make the long-extending portion L2-1 toward the back surface BS(L1) of the long-extending portion L1 and at least partially overlap the long-extending portion L1 on the Z direction. Subsequently, step 208 is performed to fix the side of the display panel near the flexible circuit board to keep the shape of the bent side of the display panel after the first bending step. The method for fixing the structure/shape of the bent side of the display panel in the step 208 may include using a supporting structure, but is not limited thereto. Afterward, optionally, step 209 may be performed to carry out a first inspection to check if defects such as cracks or line broken occur in the display panel 100 after the first bending step. The first inspection may use optical inspection device or other suitable inspection devices, but is not limited thereto.

If defects are found in the display panel, the display panel fails to pass the first inspection and the step 209' is then performed to scrap the display panel. If no defects are found in the display panel, the display panel passes the first inspection and the step 210 is then performed to bend (second bending step) another side of the display panel that is away from the flexible circuit board. As shown in FIG. 1B, the short-extending portion S2 is bent in such a way that the wraparound edges 102 surround the surrounding axis AX to make the long-extending portion L2-2 toward the back surface BS(L1) of the long-extending portion L1 and at least partially overlap the long-extending portion L1 on the Z direction. According to some embodiments of the present disclosure, as shown in FIG. 1A, the non-wraparound edge 104 of the long-extending portion L2-2 is close to the non-wraparound edge 104 of the long-extending portion L2-1, and the long-extending portion L2-2 and the long-extending portion L2-2 do not overlap with each other on the Z direction. According to other embodiments of the present disclosure, as shown in FIG. 5, the long-extending portion L2-2 of the bent display panel 100 may overlap a portion of the display surface TS(L2-1) of the long-extending portion L2-1 on the Z direction.

Subsequently, step 212 is performed to fix the side of the display panel away from the flexible circuit board to keep the shape of the bent side of the display panel after the second bending step. The method for fixing the structure/shape of the bent side of the display panel in the step 212 may include using a supporting structure, but is not limited thereto. Afterward, optionally, step 213 may be performed to carry out a second inspection to check if defects such as cracks or line broken occur in the display panel 100 after the second bending step. The second inspection may use optical inspection device or other suitable inspection devices, but is not limited thereto. If defects are found in the display panel, the display panel fails to pass the second inspection and the step 213' is then performed to scrap the display panel. If no defects are found in the display panel, the display panel passes the second inspection and step 214 is then performed to end the wrapping process 200. Afterward, subsequent process steps such as back-end module assembly or inspections after assembly may be performed, but are not limited thereto.

In other embodiments, as illustrated below, the wrapping process 200 may be applied to wrap a display panel 100 having a flexible circuit board 130 bonded to a wraparound edge 102 of the display panel 100. Please refer to FIG. 9, FIG. 10 and FIG. 12 at the same time in the following illustrated embodiment.

The wrapping process 200 starts at the step 202. Following, the step 204 is performed to connect the display panel and the flexible circuit board. As shown in FIG. 9 and FIG. 10, a side-extending portion S3 is disposed on the wraparound edge 102 of one side of the long-extending portion L1, and the flexible circuit board 130 is bonded to the side-extending portion S3. Following, the step 206 is performed to bend (first bending step) the side of the display panel near the flexible circuit board. As shown in FIG. 9 and FIG. 10, the side-extending portion S3 is bent toward the back surface BS(L1) of the long-extending portion L1 to make the flexible circuit board 130 and the long-extending portion L1 at least partially overlapped on the Z direction. Subsequently, step 208 is performed to fix the side of the display panel near the flexible circuit board to keep the shape of the bent side of the display panel after the first bending step. The method for fixing the structure/shape of the bent side of the display panel in the step 208 may include using a supporting structure, but is not limited thereto. Afterward, optionally, step 209 may be performed to carry out a first inspection to check if defects such as cracks or line broken occur in the display panel 100 after the first bending step. The first inspection may use optical inspection device or other suitable inspection devices, but is not limited thereto.

If defects are found in the display panel, the display panel fails to pass the first inspection and the step 209' is then performed to scrap the display panel. If no defects are found in the display panel, the display panel passes the first inspection and the step 210 is then performed to bend (second bending step) the other sides of the display panel that is away from the flexible circuit board. As shown in FIG. 9 and FIG. 10, the short-extending portion S2 is bent in such a way that the wraparound edges 102 surround the surrounding axis AX to make the long-extending portion L2-2 toward the back surface BS(L1) of the long-extending portion L1 and at least partially overlap the long-extending portion L1 on the Z direction. In the step 210, the short-extending portion S1 is bent to make the long-extending portion L2-1 toward the back surface BS(L1) of the long-extending portion L1 and at least partially overlap the long-extending portion L1 on the Z direction. According to some embodiments of the present disclosure, after the second bending step, the long-extending portion L2-2 and the long-extending portion L2-1 may be close to each other but do not overlap. According to some embodiments of the present disclosure, after the second bending step, the long-extending portion L2-2 and the long-extending portion L2-1 may partially overlap.

Subsequently, step 212 is performed to fix the side of the display panel away from the flexible circuit board to keep the shape of the bent side of the display panel after the second bending step. The method for fixing the structure/shape of the bent side of the display panel in the step 212 may include using a supporting structure, but is not limited thereto. Afterward, optionally, step 213 may be performed to carry out a second inspection to check if defects such as cracks or line broken occur in the display panel 100 after the second bending step. The second inspection may use optical inspection device or other suitable inspection devices, but is not limited thereto. If defects are found in the display panel, the display panel fails to pass the second inspection and the step 213' is then performed to scrap the display panel. If no defects are found in the display panel, the display panel passes the second inspection and step 214 is then performed to end the wrapping process 200.

According to the above, no matter the wrapping process 200 provided by the present disclosure is applied to wrap a display panel 100, and bond a flexible circuit board 130 to a non-wraparound edge 104 or to a wraparound edge 102 of the display panel 100, the side of the display panel 100 that is close to the flexible circuit board 130 is firstly bent by a first bending step and followed by a first inspection to filter out abnormal display panel. After that, a second bending step is performed to normal (no defects found) display panel 100 to bend the portion of the display panel 100 that is away from the flexible circuit board 130. In this way, invalid second bending step on abnormal display panel may be reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:

a display panel in a bent form, which comprises two first edges opposite to each other and surrounding a surrounding axis, two second edges opposite to each other, a display surface and a back surface opposite to the display surface, wherein the two first edges and the two second edges surround the display surface and the back surface; and a flexible circuit board comprises a circuit component disposed thereon for controlling the display panel to display image and electrically connected to the display panel and contacting the back surface of the display panel through an adhesive layer.

2. The display device according to claim 1, wherein the display panel in the bent form comprises:

a first long-extending portion;

a second long-extending portion; and a short-extending portion between the first long-extending portion and the second long-extending portion.

3. The display device according to claim 2, wherein the first long-extending portion and the second long-extending portion are planar and the short-extending portion is curved in the bent form.

4. The display device according to claim 1, wherein the display panel comprises:

a substrate;

a circuit structure layer disposed on the substrate.

5. The display device according to claim 4, further comprising a supporting layer disposed on a back side of the substrate of the display panel.

6. The display device according to claim 1, wherein the adhesive layer is disposed between the back surface of the display panel and the flexible circuit board.

7. The display device according to claim 1, wherein the display panel is an organic light emitting diode display panel.

8. The display device according to claim 2, wherein the first long-extending portion corresponds to a first display region, the second long-extending portion corresponds to a second display region, the short-extending portion corresponds to a third display region.

9. The display device according to claim 2, wherein the display panel in the bent form further comprises a side-extending portion disposed on an edge of the first long-extending portion, wherein the flexible circuit board is bonded to the side-extending portion.

10. The display device according to claim 9, wherein the side-extending portion is bent toward a back surface of the first long-extending portion to make the flexible circuit board closed and fixed to the back surface of the first long-extending portion.

11. The display device according to claim 9, wherein an area of the side-extending portion is smaller than an area of the first long-extending portion.

12. The display device according to claim 9, wherein an edge of the side-extending portion that contacts the edge of the first long-extending portion is smaller than the edge of the first long-extending portion.

* * * * *